US010991605B2

(12) United States Patent
Yamakawa et al.

(10) Patent No.: US 10,991,605 B2
(45) Date of Patent: *Apr. 27, 2021

(54) SUBSTRATE PROCESSING DEVICE, METHOD FOR CONTROLLING SUBSTRATE PROCESSING DEVICE, AND STORAGE MEDIUM STORING A PROGRAM

(71) Applicant: EBARA CORPORATION, Tokyo (JP)

(72) Inventors: Junitsu Yamakawa, Tokyo (JP); Takuya Tsushima, Tokyo (JP)

(73) Assignee: EBARA CORPORATION, Tokyo (JP)

(*) Notice: Subject to any disclaimer, the term of this patent is extended or adjusted under 35 U.S.C. 154(b) by 44 days.

This patent is subject to a terminal disclaimer.

(21) Appl. No.: 16/217,936

(22) Filed: Dec. 12, 2018

(65) Prior Publication Data
US 2019/0181026 A1 Jun. 13, 2019

(30) Foreign Application Priority Data

Dec. 13, 2017 (JP) .............. JP2017-238793

(51) Int. Cl.
H01L 21/67 (2006.01)
G05B 19/402 (2006.01)
G06T 7/73 (2017.01)
C25D 17/00 (2006.01)
C25D 21/12 (2006.01)
H01L 21/68 (2006.01)
H01L 21/677 (2006.01)
B25J 9/16 (2006.01)

(52) U.S. Cl.
CPC ...... H01L 21/67259 (2013.01); B25J 9/1697 (2013.01); C25D 17/001 (2013.01);
(Continued)

(58) Field of Classification Search
CPC ............ H01L 21/67259; H01L 21/681; H01L 21/67766; H01L 21/67011;
(Continued)

(56) References Cited

U.S. PATENT DOCUMENTS

2001/0028456 A1* 10/2001 Nishi .................. G03F 7/70866
356/400
2002/0089655 A1* 7/2002 Kida ................. H01L 21/68707
355/72

(Continued)

FOREIGN PATENT DOCUMENTS

CN 101461053 A 6/2009
JP 2003-017545 A 1/2003
(Continued)

Primary Examiner — Thomas C Lee
Assistant Examiner — Michael Tang
(74) Attorney, Agent, or Firm — BakerHostetler

(57) ABSTRACT

A substrate processing device for processing a substrate, comprising an image sensor configured to detect positions of two corners on at least one diagonal of a substrate when the substrate is transferred to a predetermined position; an illuminating device that can be disposed so as to illuminate the two corners of the substrate on an opposite side of the substrate at the predetermined position relative to the image sensor; and a control device configured to determine the position of the substrate on the basis of the positions of the two corners, which are detected by the image sensor, the control device being configured to be capable of changing at least either light quantity or wavelength of output light of the illuminating device.

10 Claims, 18 Drawing Sheets

(52) U.S. Cl.
CPC ............ *C25D 21/12* (2013.01); *G05B 19/402* (2013.01); *G06T 7/74* (2017.01); *H01L 21/6723* (2013.01); *H01L 21/67766* (2013.01); *H01L 21/681* (2013.01); *G05B 2219/42249* (2013.01); *G06T 2207/10152* (2013.01); *G06T 2207/30148* (2013.01)

(58) Field of Classification Search
CPC ............ H01L 21/67121; H01L 21/6723; B25J 9/1697; G05B 19/402; G05B 2219/42249; G06T 7/74; G06T 2207/10152; G06T 2207/30148; C25D 7/12; C25D 17/001; C25D 21/12
See application file for complete search history.

(56) References Cited

U.S. PATENT DOCUMENTS

| | | | | |
|---|---|---|---|---|
| 2007/0018082 | A1* | 1/2007 | Ohtsu | B82Y 20/00 250/227.3 |
| 2008/0073518 | A1* | 3/2008 | Itoh | B82Y 20/00 250/306 |
| 2010/0030347 | A1 | 2/2010 | Shindo | |
| 2012/0009051 | A1* | 1/2012 | Ruth | B65G 47/22 414/783 |
| 2012/0046904 | A1* | 2/2012 | Hayashi | H01L 21/681 702/150 |
| 2012/0100709 | A1 | 4/2012 | Minami | |
| 2012/0224945 | A1 | 9/2012 | Douki et al. | |
| 2014/0318608 | A1* | 10/2014 | Sakata | H01L 22/20 136/252 |
| 2015/0281654 | A1* | 10/2015 | Miyazaki | G01B 11/0616 348/86 |
| 2017/0354858 | A1* | 12/2017 | Lewis | A63B 69/36 |
| 2018/0092521 | A1* | 4/2018 | Nolan | A61B 1/00009 |
| 2019/0145904 | A1* | 5/2019 | Lopez | G01N 21/90 |

FOREIGN PATENT DOCUMENTS

| | | | |
|---|---|---|---|
| JP | 2003017545 A | * | 1/2003 |
| JP | 2014-053343 A | | 3/2014 |
| JP | 2014053343 A | * | 3/2014 |
| JP | 5750327 B2 | | 7/2015 |
| KR | 2012-0100764 A | | 9/2012 |
| KR | 101626374 B1 | * | 6/2016 |

* cited by examiner

Fig. 15A

| W | a |
|---|---|
| $W_1$ | $a_1$ |
| $W_2$ | $a_2$ |
| ⋮ | ⋮ |
| $W_n$ | $a_n$ |
| ⋮ | ⋮ |

Fig. 15B

| $W_m$ | $W_t$ | $a_i$ | $a_f$ |
|---|---|---|---|
| $W_{m1}$ | $W_{t1}$ | $a_{i1}$ | $a_{f1}$ |
| $W_{m2}$ | $W_{t2}$ | $a_{i2}$ | $a_{f2}$ |
| ⋮ | ⋮ | ⋮ | ⋮ |
| $W_{mn}$ | $W_{tn}$ | $a_{in}$ | $a_{fn}$ |
| ⋮ | ⋮ | ⋮ | ⋮ |

SUBSTRATE PROCESSING DEVICE, METHOD FOR CONTROLLING SUBSTRATE PROCESSING DEVICE, AND STORAGE MEDIUM STORING A PROGRAM

CROSS-REFERENCE TO RELATED APPLICATION

This application is based upon and claims benefit of priority from Japanese Patent Application Nos. 2017-238793 filed on Dec. 13, 2017, the entire contents of which is incorporated herein by reference.

TECHNICAL FIELD

The present invention relates to a substrate processing device, a method for controlling the substrate processing device, and a storage medium storing a program for causing a computer to execute the method for controlling the substrate processing device.

BACKGROUND ART

There are plating devices that plate substrates mounted on a substrate holder. In these plating devices, a substrate may be displaced from a predetermined proper position when mounted on and/or dismounted from the substrate holder. The displacement of a substrate might occur due to warpage of the substrate holder, warpage of the table on which the substrate holder is placed, warpage of the substrate, or a tilt of the substrate holder, which is caused by water drops on a substrate surface, or dust on the table. Such a positional displacement creates the possibility that a plating process may not be properly performed on a substrate which is a workpiece to be plated.

There have been proposed technologies for detecting the position of a substrate when it is mounted on the substrate holder and correcting the position of the substrate if the substrate is displaced from its proper position (for example, Patent Literature 1). According to the technology described in the Patent Literature 1, a securing/retaining member 15 of a substrate holder 110 is provided with a notch 17 at a position corresponding to an edge of a substrate 500, and a laser sensor 1140 is disposed so that when the substrate 500 is placed in a proper position, a surface of the notch 17 can be illuminated without being blocked by the substrate 500. When the substrate 500 is placed on the securing/retaining member 15, the laser sensor 1140 measures distance. If the distance measured is a distance A to the notch 17, it is determined that the substrate 500 is not displaced from its position. If the distance measured is a distance W1 (<A) to the substrate 500, it is determined that the substrate 500 is displaced from its position. According to this technology, the substrate holder is provided with the notch for position measurement, so that a design modification is required in a larger number of substrate holders to be used. If the substrate holder itself is thin, it might be difficult to form the notch so as to ensure a sufficient detection accuracy.

In general, various semiconductor manufacturing devices may be required in future to process, with relatively high accuracy, a variety of substrates that have not existed so far, which include substrates with more intricate patterns than conventional ones and substrates of various materials as semiconductor materials. These semiconductor manufacturing devices are expected to be more accurate than the existing ones in transferring substrates onto the processing table and positioning the substrates. The semiconductor manufacturing devices are further expected to shorten the processing time required for the positioning of the substrates.

CITATION LIST

Patent Literature

PTL 1: Japanese Patent No. 5750327

SUMMARY OF INVENTION

Technical Problem

An object of the present invention is to solve the above-described problem at least to some extent.

Solution to Problem

According to one aspect of the present invention, there is provided a substrate processing device for processing a substrate, comprising: an image sensor configured to detect positions of two corners on at least one diagonal of a substrate when the substrate is transferred to a predetermined position, an illuminating device that can be disposed so as to illuminate the two corners of the substrate on an opposite side of the substrate at the predetermined position relative to the image sensor, and a control device configured to determine the position of the substrate on the basis of the positions of the two corners, which are detected by the image sensor, the control device being configured to change at least either light quantity or wavelength of output light of the illuminating device.

According to one aspect of the present invention, there is provided a substrate processing device for processing a substrate, comprising: an image sensor for detecting positions of two corners on at least one diagonal of a substrate when the substrate is transferred to a predetermined position, an illuminating device that can be disposed so as to illuminate the two corners of the substrate on an opposite side of the substrate at the predetermined position relative to the image sensor, and a control device configured to determine the position of the substrate on the basis of the positions of the two corners, which are detected by the image sensor, the control device being configured to calculate a center position and rotation angle of the substrate as a position of the substrate, and to correct the rotation angle of the substrate to a predetermined rotation angle and then correct the center position of the substrate to a predetermined center position if the calculated center position and rotation angle of the substrate differ from the predetermined center position and rotation angle.

BRIEF DESCRIPTION OF DRAWINGS

FIG. 15A shows an example of formation of a database used to change setup conditions of the illuminating device;

FIG. 15B shows a specific example of a database in which the combination of characteristics of the substrate corresponds to the data on setup conditions of the illuminating device;

DESCRIPTION OF EMBODIMENTS

Figure 1:
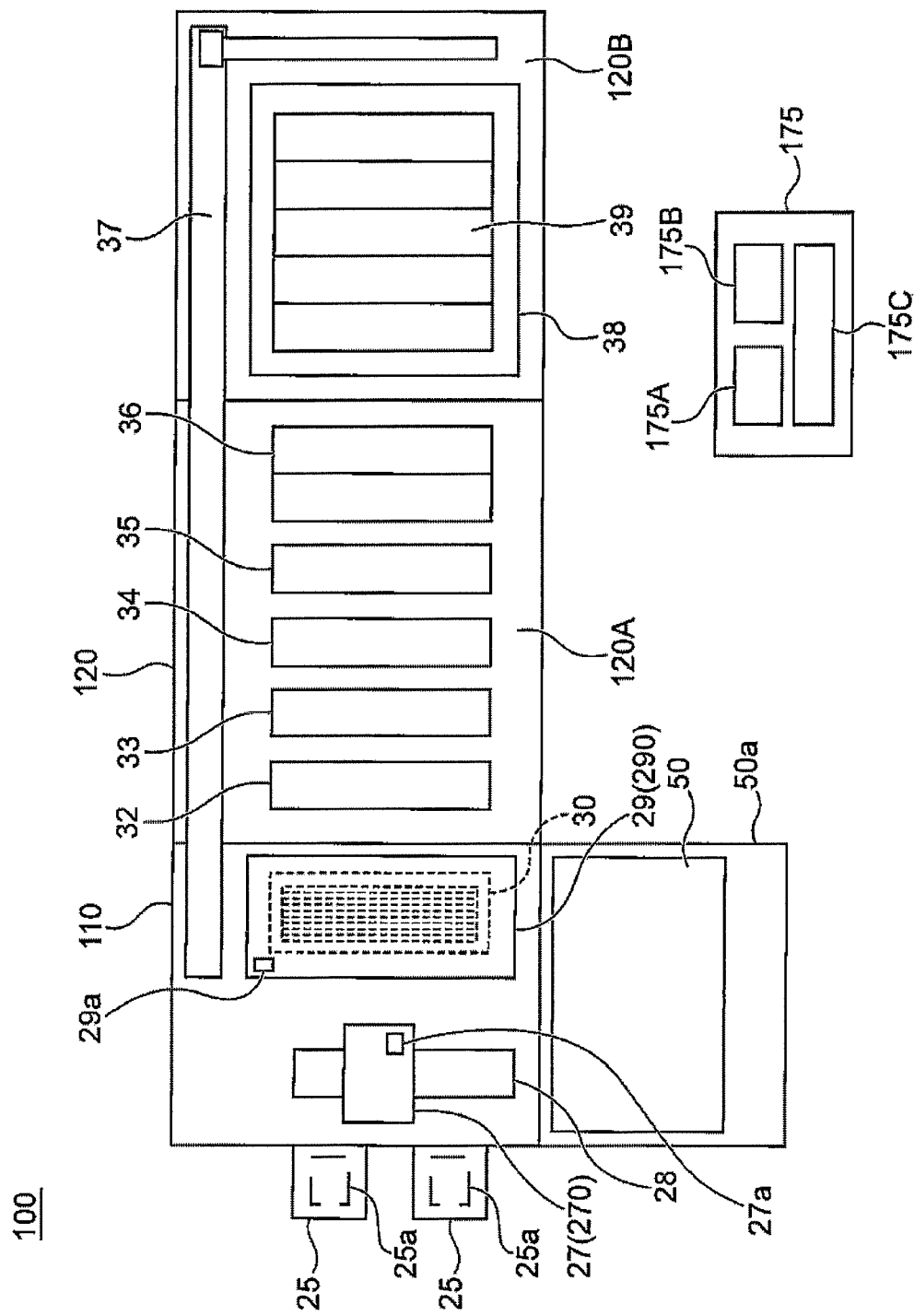
FIG. 1 shows the overall arrangement of a substrate processing device according to one embodiment of the invention.

The embodiments of the present invention are described with reference to the attached drawings. Similar or equivalent members of the embodiments will be provided with the same reference numerals, and repetitive descriptions will be omitted. For convenience of explanation, the terms "top," "bottom," "left," "right," etc., used in this specification refer to positions or directions as viewed in the illustrative drawings and may be different in actual arrangement of the device in use. When one member is "located on the opposite side of the substrate" relative to another member, this means that the one member is located to face any one of substrate surfaces of a substrate, and the another member is located to face a substrate surface located on the opposite side to the substrate surface which the one member faces. The substrate may be provided with wiring on one or both sides thereof.

First Embodiment

FIG. 1 shows the overall arrangement of a substrate processing device 100 according to one embodiment of the present invention. In this example, the substrate processing device 100 is an electrolytic plating device. In this specification, the electrolytic plating device is described as an example. The present invention can be applied to other substrate processing devices including any other plating devices, polishing devices, grinding devices, coating devices, etching devices, and other like devices.

The substrate processing device 100 mainly comprises a loading/unloading section 110 for loading and unloading a substrate (workpiece) on and from the substrate holder 11, a processing section 120 for processing the substrate S, and a cleaning section 50a. The processing section 120 further comprises a pre-processing/post-processing section 120A for preprocessing and post-processing substrates and a plating section 120B for plating the substrates. The substrates include polygonal substrates and circular substrates. The polygonal substrates include glass substrates, liquid crystal substrates and printed substrates in polygonal shapes, such as a rectangular shape, and other polygonal workpieces. Circular substrates include semiconductor wafers, glass substrates, and other circular workpieces.

The loading/unloading section 110 comprises two cassette tables 25 and a substrate mounting/dismounting device 29. The cassette tables 25 are to be equipped with cassettes 25a containing substrates S. The substrate mounting/dismounting device 29 is disposed in a substrate mounting/dismounting section 290. The substrate mounting/dismounting device 29 is configured to mount and dismount the substrate S on and from the substrate holder 11. The substrate mounting/dismounting device 29 comprises a control device 29a. The control device 29a communicates with a controller 175 of the substrate processing device 100 and controls the movements of the substrate mounting/dismounting device 29. A stocker 30 for accommodating the substrate holders 11 is disposed near (e.g., below) the substrate mounting/dismounting device 29. At the center of the above-mentioned units 25, 29, and 30, a substrate transfer device 270 is disposed, which comprises a transfer robot 27 for transferring substrates between the units. The substrate transfer device 270 is configured to be driven by a drive mechanism 28. The substrate transfer device 270 comprises a controller 27a. The controller 27a communicates with the controller 175 of the substrate processing device 100 and controls the movements of the substrate transfer device 270.

The cleaning section 50a has a cleaning device 50 for cleaning and drying substrates that have been plated. The substrate transfer device 270 is configured to transfer the substrates that have been plated to the cleaning device 50 and to take the cleaned substrates out of the cleaning device 50.

The pre-processing/post-processing section 120A comprises a prewet tank 32, a presoak tank 33, a prerinse tank 34, a blow tank 35, and a rinse tank 36. In the prewet tank 32, substrates are immersed in pure water. In the presoak tank 33, an oxide film on a surface of a conductive layer, such as a seed layer or the like formed on a surface of the substrate, is etched away. In the prerinse tank 34, the substrates that have been presoaked are cleaned in a cleaning liquid (pure water or the like) together with the substrate holder. In the blow tank 35, the substrates that have been cleaned are drained. In the rinse tank 36, the substrates that have been plated are cleaned in cleaning liquid together with the substrate holder. The above-described configuration of the pre-processing/post-processing section 120A of the substrate processing device 100 is merely an example. The pre-processing/post-processing section 120A of the substrate processing device 100 is not limited in configuration and may be configured in any manner.

The plating section 120B has a plurality of plating tanks 39 comprising an overflow tank 38. Each of the plating tanks 39 stores one substrate inside. The substrate is immersed in a plating solution contained in the plating tank 39 to be plated with copper or the like on the surface thereof. It is not necessary to use any particular type of plating solution. Different plating solutions may be used depending on the intended use.

The substrate processing device 100 includes a substrate holder transfer device 37 located at the side of the above-mentioned devices. The substrate holder transfer device 37 is of, for example, a linear motor type, and transfers the substrate holder with substrates between the above-mentioned devices. This substrate holder transfer device 37 is configured to transfer the substrate holder between the substrate mounting/dismounting device 29, the prewet tank 32, the presoak tank 33, the prerinse tank 34, the blow tank 35, the rinse tank 36, and the plating tank 39.

The plating system including the substrate processing device 100 thus configured comprises the controller 175 configured to control the above-described sections. The controller 175 comprises a memory 175B storing a variety of setting data and a variety of programs, a CPU 175A for executing the programs stored in the memory 175B, and a control section 175C implemented by execution of a program by the CPU 175A. A storage medium which forms the memory 175B may include one or more desired storage media, such as ROMs, RAMs, hard discs, CD-ROMs, DVD-ROMs, and flexible discs. The programs stored in the memory 175A include, for example, a program for implementing transfer control of the substrate transfer device 270, a program for controlling a substrate position detector 60 (described later), a program for implementing control of mounting/dismounting of the substrate on and from the substrate holder in the substrate mounting/dismounting device 29, a program for implementing transfer control of the substrate holder transfer device 37, and a program for implementing plating control of the plating tanks 39. The controller 175 is configured to be able to communicate with a master controller, not shown, for comprehensively controlling the substrate processing device 100 and other relevant devices. The controller 175 is thus capable of exchanging data with a database of the master controller.

Figure 2:
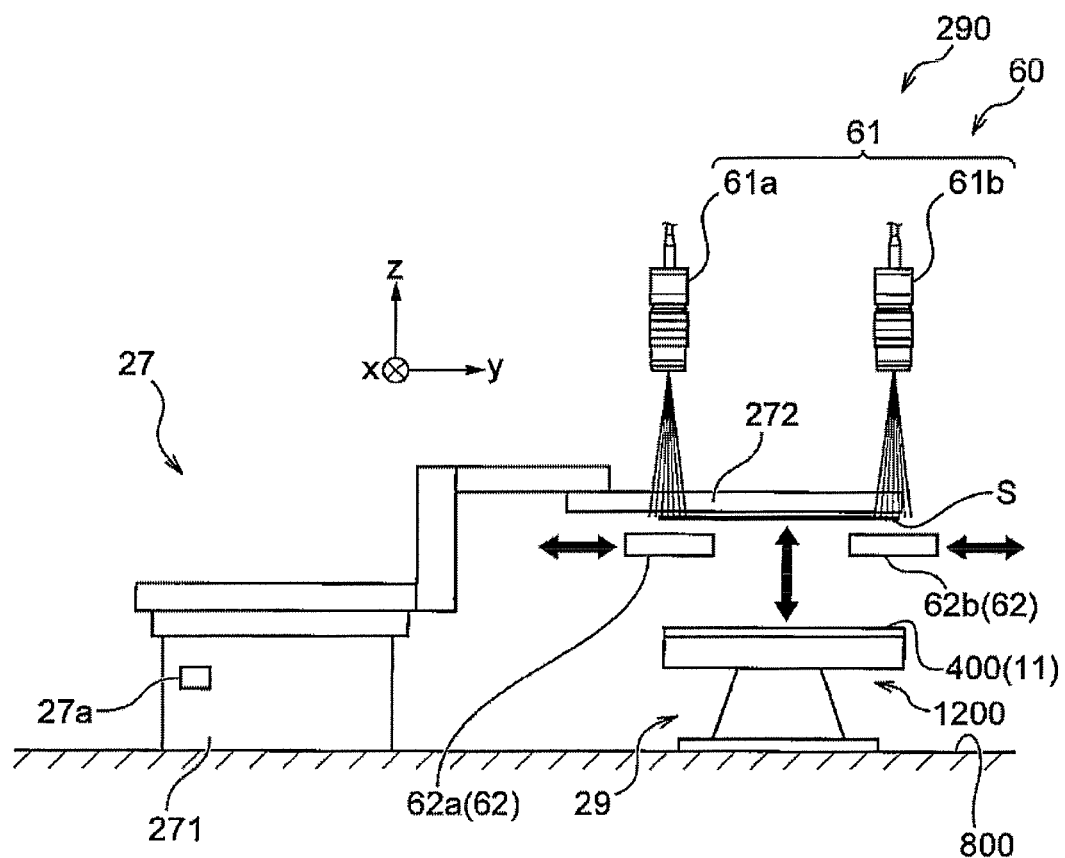
FIG. 2 is a schematic view of a substrate position detector according to a first embodiment.

FIG. 2 is a schematic view of the substrate position detector 60 according to a first embodiment. The substrate position detector 60 has an image sensor 61 (61a, 61b) and an illuminating device 62 (62a, 62b). The present embodiment will be described with an example in which the image sensor 61 and the illuminating device 62 of the substrate position detector 60 are disposed in the substrate mounting/dismounting section 290. As shown in FIG. 2, the substrate mounting/dismounting section 290 comprises the substrate mounting/dismounting device 29 having a rotating device 1200. The rotating device 1200 has a support plate 1210 on which a second holding member 400 of the substrate holder 11 is attached. In this state, the substrate S is attached to the second holding member 400. The substrate S is taken out of the cassette 25a by the transfer robot 27 and transferred onto the second holding member 400. The substrate holder 11 further comprises a first holding member, not shown. The substrate holder 11 is a member which holds the substrate S between the first holding member and the second holding member 400.

Figure 3A:
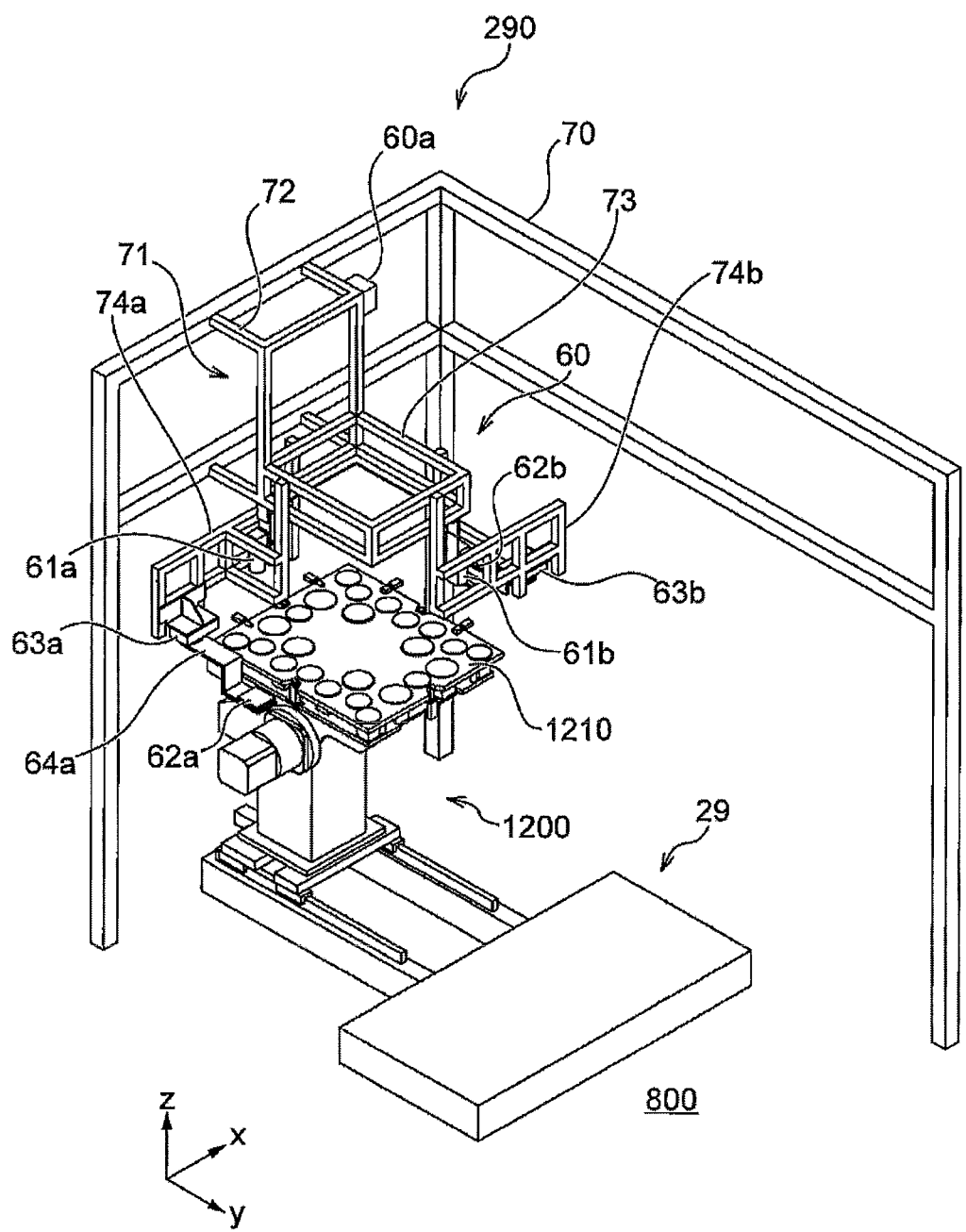
FIG. 3A is a perspective view of the substrate position detector of the first embodiment at a non-imaging position.

The transfer robot 27 comprises a robot body 271, a robot hand 272 attached to the robot body 271, and a controller 27a. The controller 27a controls the movement of the robot hand 272. The robot hand 272 is capable of holding the substrate S in a contact or non-contact manner. The robot hand 272 uses, for example, a Bernoulli chuck to hold the substrate S in the non-contact manner. The transfer robot 27 is a multi-axis robot capable of transferring the substrate S held by the robot hand 272 in the x-, y-, and z-direction and also a rotational direction. The x-, y-, and z-axes are defined as shown in FIG. 3A. For example, the x-axis may be perpendicular to the reciprocating direction of the rotating device 1200, the y-axis in the reciprocating direction of the rotating device 1200, and the z-axis perpendicular to the x- and y-axes. In this case, the x- and y-axes are parallel to a mounting plane 800, and the z-axis is perpendicular to the mounting plane 800. There may be provided two or more robot hands.

The image sensors 61a and 61b are disposed adjacent to the substrate mounting/dismounting device 29. The image sensors 61a and 61b are, for example, cameras. The image sensors 61a and 61b are located at such positions that the image sensors 61a and 61b can detect corners of the substrate S when the substrate S is transferred by the robot hand 272 to directly above a target mounting position for the substrate S on the second holding member 400 of the substrate holder 11.

Figure 12:
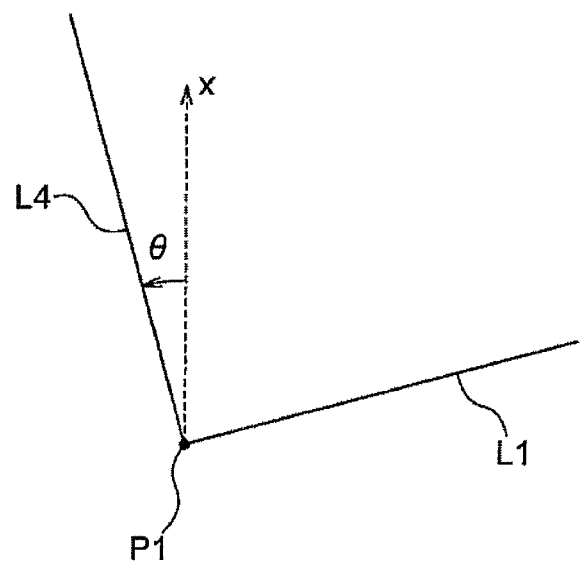
FIG. 12 describes a rotation angle of the substrate.

The "target mounting position" refers to a proper position at which the substrate S is to be positioned when the substrate S is placed on the second holding member 400. In the present embodiment, the "target mounting position" is defined as a target center position $(x_t, y_t)$ for the center of the substrate S and a target rotation angle $\theta_0$ for the substrate S. The rotation angle of the substrate S is defined as the rotation angle $\theta$ at which a side of the substrate S, which extends along the x-axis (or y-axis), on the x-y plane is inclined relative to the x-axis (or y-axis). FIG. 12 shows a case in which an angle at which a side L4 extending along the x-axis is inclined relative to the x-axis is a rotation angle $\theta$. The target rotation angle $\theta_0$ is the angle of a target direction in which the substrate S is supposed to be oriented relative to the x-axis (or y-axis) on the second holding member 400. In this embodiment, the target direction coincides with the x-axis (or y-axis) so that the target rotation angle $\theta_0$ equals 0. In this case, the rotation angle $\theta$ of the substrate S is equal to zero degree when the side of the substrate S which extends along the x-axis (or y-axis) is parallel and not inclined to the x-axis (or y-axis). In short, the target rotation angle $\theta_0$ equals 0. The target direction in which the substrate S is supposed to be oriented on the second holding member 400 does not necessarily have to be parallel to the x- or y-axis.

The phrase "directly above a target mounting position" refers to a position in which the substrate S, when moved down exactly in the z-direction, will be disposed at the target mounting position (the target center position and the target rotation angle) on the second holding member 400. In other words, when the position of the substrate S (the center position and the rotation angle) on the x-y plane coincides with the target mounting position (the target center position and the target rotation angle) on the second holding member 400, and only the z-coordinate does not coincide with the target mounting position.

The illuminating devices 62a and 62b are provided on the opposite side of the substrate S relative to the image sensors 61a and 61b. The illuminating devices 62a and 62b are so positioned as to illuminate the corners of the substrate S from the opposite side to the image sensors 61a and 61b. The illuminating devices 62a and 62b are backlights comprising LEDs. The illuminating devices 62a and 62b are configured to move between their respective imaging positions where they are opposed to the image sensors 61a and 61b and their respective retracting positions where they are moved outward from the imaging positions. This prevents the robot hand 272 from obstructing the transfer path of the substrate S to the second holding member 400. When the corners of the substrate S are being taken by the image sensors 61a and 61b, the background of the substrate S, illuminated by the illuminating devices 62a and 62b from the opposite side, appears white, making the outline of the substrate S clear. Since the illuminating devices 62a and 62b are located between the substrate S and the second holding member 400, the outline of the substrate S can be made clear even if the outer periphery and the vicinity of the substrate S are similar in color to the second holding member 400.

When the substrate S is transferred by the robot hand 272 to be located directly above the target mounting position of the second holding member 400 of the substrate holder 11, the illuminating devices 62a and 62b will be moved to their respective imaging positions to illuminate two of the four corners of the substrate S. In this state, the image sensors 61a and 61b take images of two corners on a diagonal of the substrate S. These images are used to detect the position of each corner (x- and y-coordinates), and the direction (on the x-y plane) of at least one side of the two adjacent sides at each corner or one of the corners. The coordinates $(x_0, y_0)$ of the center position of the substrate S are calculated from the positions of the two corners, and the rotation angle $\theta$ of the substrate S is calculated from the direction of at least one side of two adjacent sides. It is determined whether error between the calculated coordinates $(x_0, y_0)$ of the center position and the calculated rotation angle $\theta$ on the one hand and the target mounting position (target center position $(x_t, y_t)$ and rotation angle $\theta_0=0$) on the other is within a predetermined range. If the error between the calculated coordinates $(x_0, y_0)$ of the center position and the calculated rotation angle $\theta$ on the one hand and the target mounting position and rotation angle on the other hand is within the predetermined range, the illuminating devices 62a and 62b are moved to their respective retracting positions, and the substrate S is moved down onto the second holding member 400. If the error between the calculated coordinates $(x_0, y_0)$ of the center position and the calculated rotation angle $\theta$ on the one hand and the target mounting position and rotation angle on the other hand is out of the predetermined range, the robot hand 272 is moved in the x- and y-directions and/or in a rotational direction on the x-y plane to correct the position of the substrate S so that the coordinates $(x_0, y_0)$ of the center position and the rotation angle $\theta$ of the substrate S come close to the target center position and rotational position, respectively. Subsequently, the coordinates $(x_0, y_0)$ of the center position and the rotation angle $\theta$ of the substrate S are obtained by imaging the position of the substrate S again and after the error between the coordinates of the center position and the rotation angle of the substrate S on the one hand and the target center position and rotational position on the other hand is within the predetermined range, the substrate S is moved down onto the second holding member 400.

(Configuration of the Substrate Position Detector)

Figure 3B:
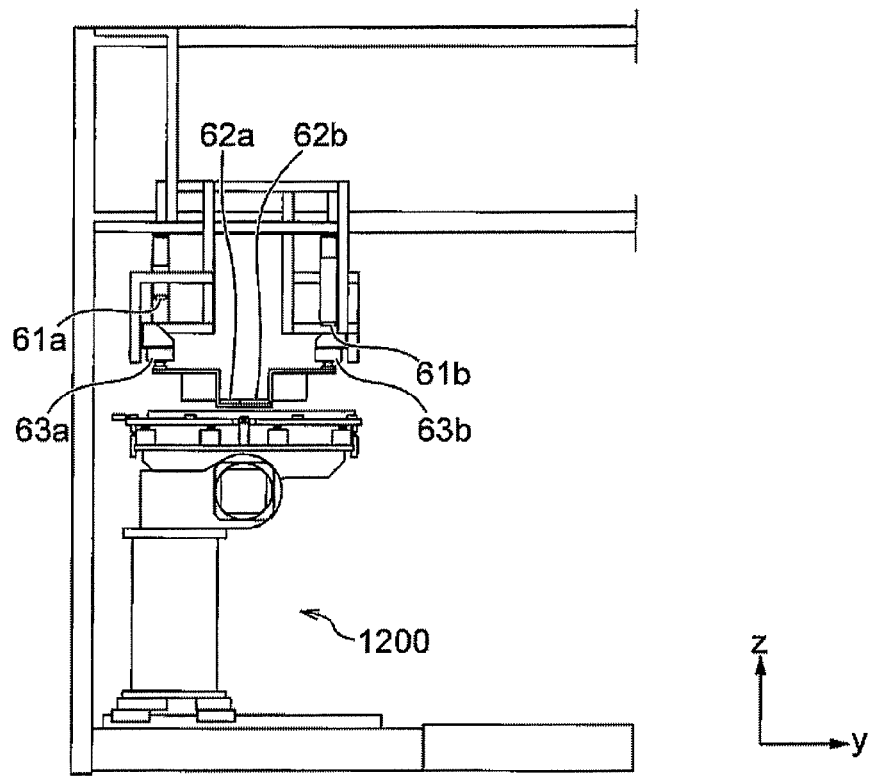
FIG. 3B is a side view of a substrate position measurement mechanism of the first embodiment at the non-imaging position.
Figure 3C:
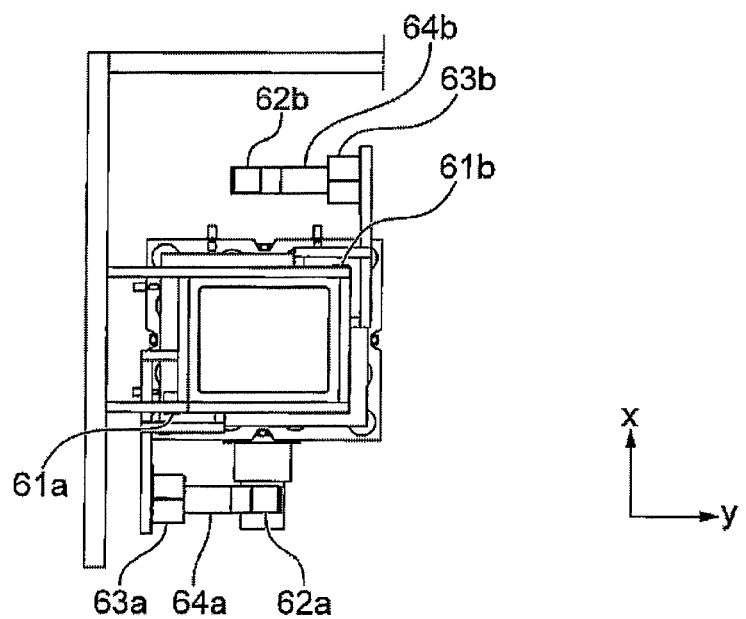
FIG. 3C is a plan view of the substrate position detector of the first embodiment at the non-imaging position.
Figure 4A:
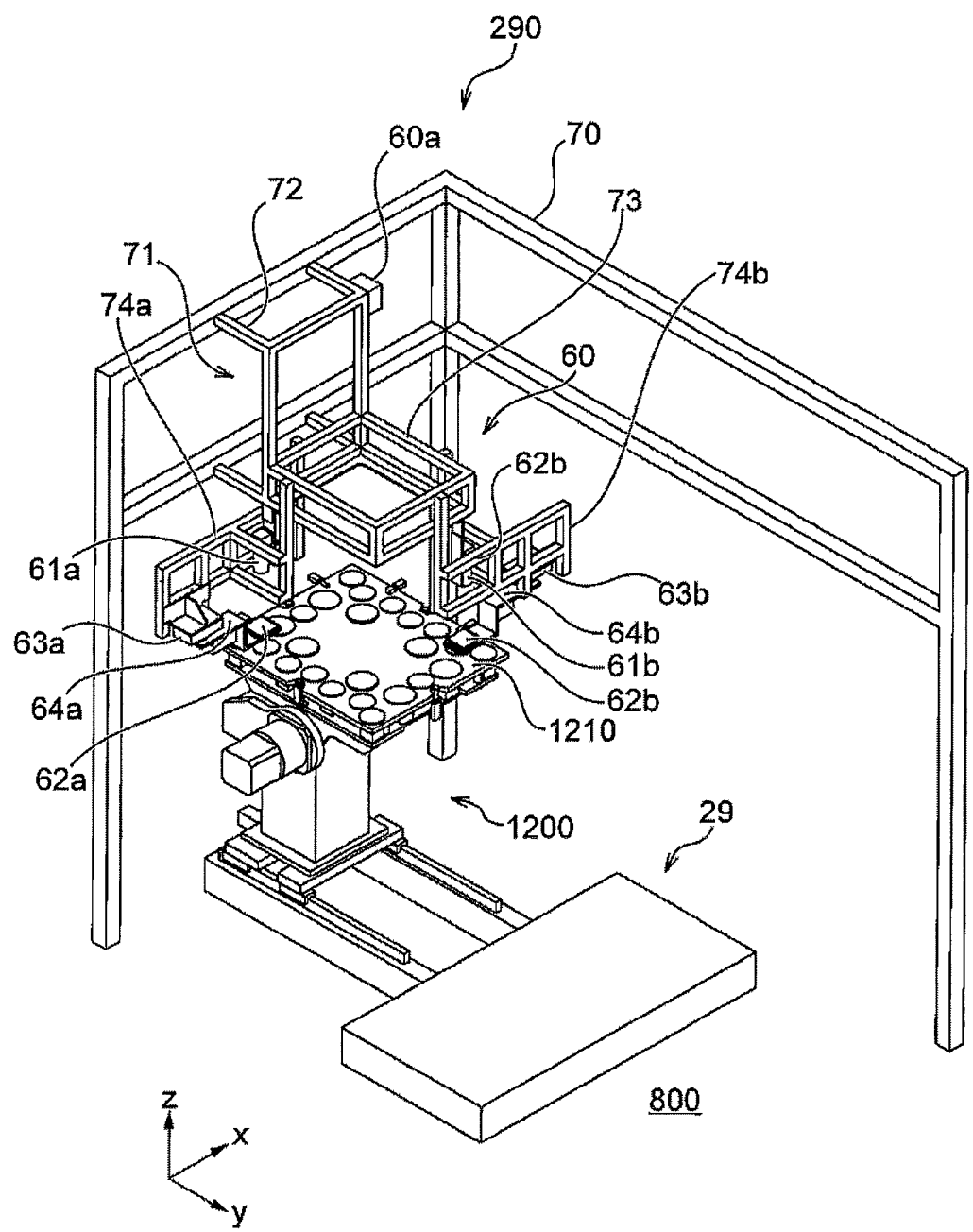
FIG. 4A is a perspective view of the substrate position detector of the first embodiment at an imaging position.
Figure 4B:
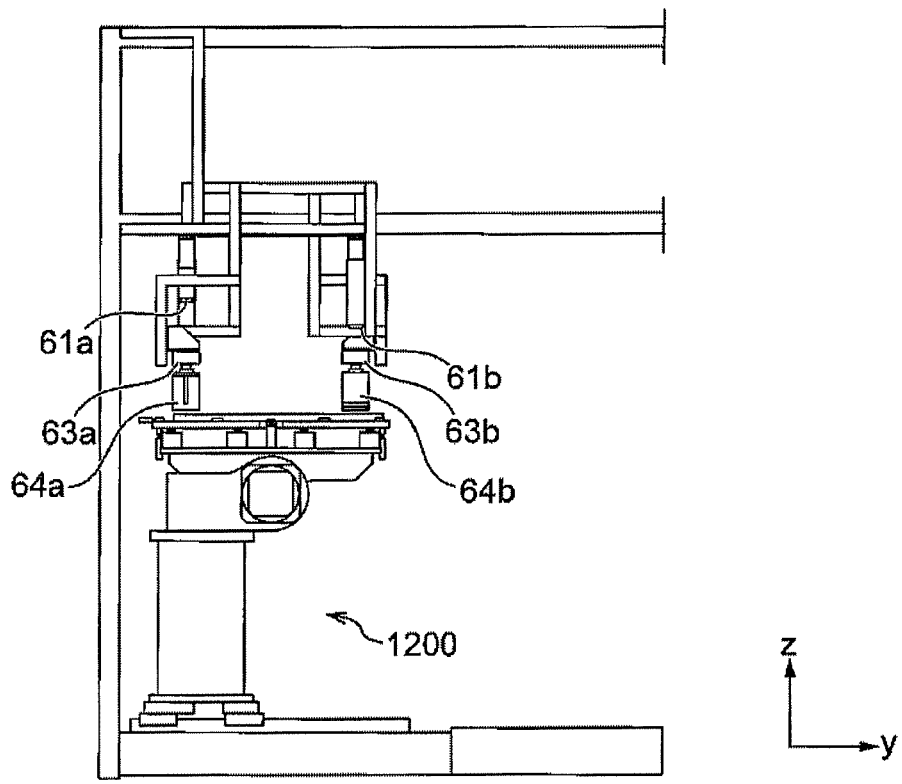
FIG. 4B is a side view of the substrate position detector of the first embodiment at the imaging position.
Figure 4C:
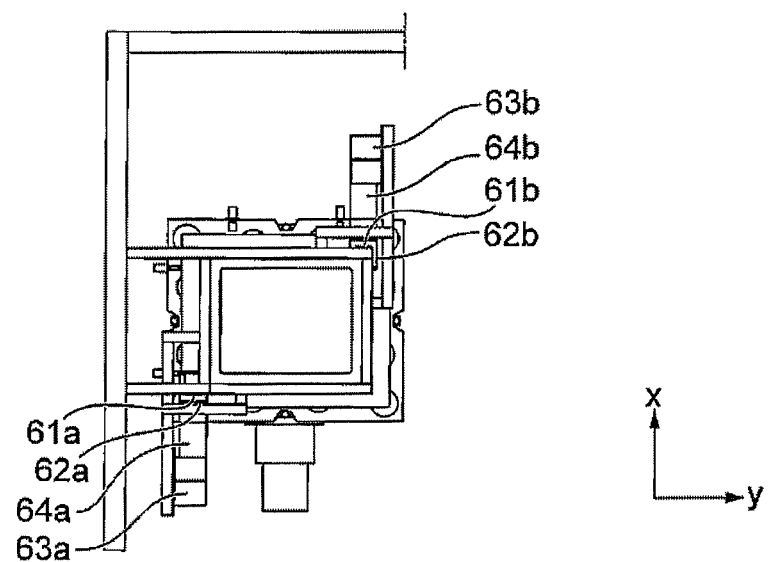
FIG. 4C is a plan view of the substrate position detector of the first embodiment at the imaging position.

FIGS. 3A, 3B, and 3C are respectively a perspective, side, and plan view of the substrate position detector 60 of the first embodiment at the non-imaging position. FIGS. 4A, 4B, and 4C are respectively a perspective, a side, and a plan view of the substrate position detector 60 of the first embodiment at the imaging position.

The substrate position detector 60 comprises image sensors 61a and 61b and illuminating devices 62a and 62b. The image sensors 61a and 61b and the illuminating devices 62a and 62b are located adjacent to the substrate mounting/dismounting device 29 in the substrate mounting/dismounting section 290. There is also provided a controller 60a for controlling the movement of the image sensors and the illuminating devices. The controller 60a is communicatively connected to the image sensors 61a and 61b and the illuminating devices 62a and 62b. Provided around the substrate mounting/dismounting device 29 is a frame 70 comprising a plurality of posts and beams. The frame 70 is located on the mounting plane 800 of the substrate mounting/dismounting device 29 adjacently to the substrate mounting/dismounting device 29. A mounting structure 71 for mounting the image sensors 61a and 61b and the illuminating devices 62a and 62b is fixed to the frame 70.

The mounting structure 71 comprises mounting members 72, 73, and 74a and 74b. The mounting member 72 is secured to the frame 70. The mounting member 73 is fixed to the mounting member 72. The mounting member 73 extends substantially parallel to the support plate 1210 above a support plate 1210 of the rotating device 1200 of the substrate mounting/dismounting device 29. The mounting member 73 is substantially rectangular in a planar view and encloses an area smaller than the support plate 1210. The image sensors 61a and 61b are attached at two corners located on a diagonal of the mounting member 73. The imaging direction of the image sensors 61a and 61b points to the support plate 1210.

The mounting members 74a and 74b are attached near the two corners of the mounting member 73, in which the image sensors 61a and 61b are attached. The mounting member 74a and 74b are closer to the support plate 1210 than the mounting member 73 is, and extend away from each other outwardly from the mounting member 73. The mounting members 74a and 74b are provided, at their ends, with rotating devices 63a and 63b. The illuminating devices 62a and 62b are attached to ends of the arms 64a and 64b of the rotating devices 63a and 63b. The illuminating devices 62a and 62b illuminate in a direction away from the support plate 1210.

The image sensors 61a and 61b are, for example, cameras. The cameras are black-and-white or color ones. From the aspect of accuracy in position detection, black-and-white cameras are preferable. The present embodiment therefore uses black-and-white cameras as the image sensors 61a and 61b. A color camera may be utilized in a case where the position detection accuracy of the color camera is sufficient enough. Another option is, for example, a black-and-while/color switchable camera. The black-and-while/color switchable camera is designed to be capable of taking color images by setting an infrared cut filter in front of an imaging element in the camera when illuminance in the device is equal to or greater than a predetermined value (when it is bright), and also capable of taking black-and-white images by removing the infrared cut filter when illuminance in the device is lower than the predetermined value (when it is dark). The image sensors 61a and 61b are attached to two corners located on a diagonal of the mounting member 73 in a substantially rectangular shape in a planar view. The image sensors 61a and 61b are so attached that their imaging direction points to the support plate 1210. The image sensors 61a and 61b are disposed at such positions as to take images of two corners on a diagonal of the substrate S when the substrate S is transferred to above the second holding member 400 on the support plate 1210.

Figure 11:
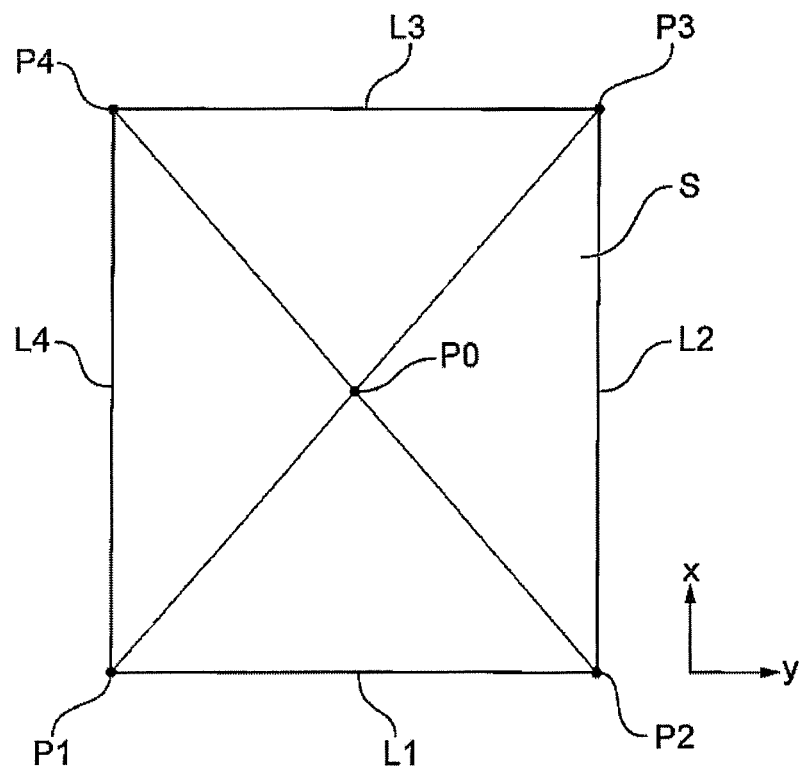
FIG. 11 is a plan view of the substrate.
Figure 13:
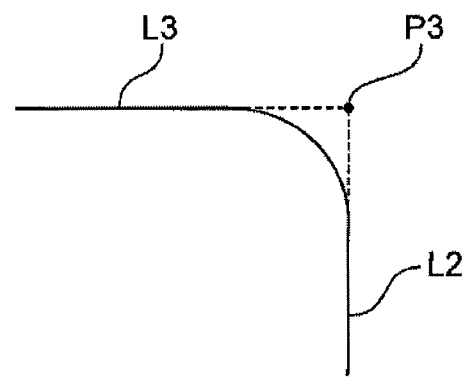
FIG. 13 describes the position of a corner of the substrate.

FIG. 11 is a plan view of the substrate S. FIG. 12 describes the rotation angle of the substrate S. FIG. 13 describes the position of a corner of the substrate. In the present embodiment, the substrate S is a substantially rectangular substrate with four sides L1, L2, L3, and L4 and four corners P1, P2, P3, and P4. A center P0 of the substrate S may be defined as an intersection point of the two diagonals. In the present embodiment, the two corners (e.g., corners P1 and P3) on a diagonal are measured, so that a midpoint of the diagonal connecting the corners P1 and P3 is calculated as a center position $(x_0, y_0)$ of the center P0.

The positions of the corners P1 to P4 are each defined as an intersection point of two adjacent sides located at each corner (adjacent sides). The positions of the corners P1 to P4 refer to the positions of the apexes of the substrate S. Since the position of the corner is defined as the intersection point of the two adjacent sides, the positions of the corners can be calculated with accuracy even if the corners are rounded or the positions of the apexes are not clear. For example, as shown in FIG. 13, if the substrate S is rounded at the corner P3, image data on the straight segments of two adjacent sides L2 and L3 at the corner are obtained, and a position at which extended lines from straight segments of the two adjacent sides intersect with each other is calculated as a position of the corner P3.

Figure 14A:
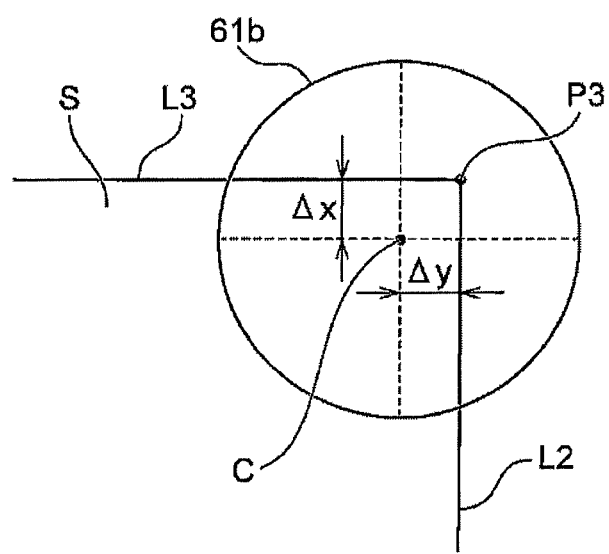
FIG. 14A describes an imaging position of the image sensor.
Figure 14B:
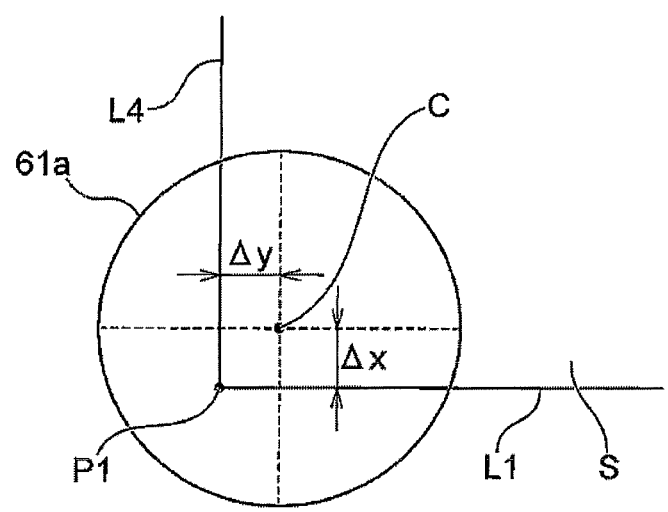
FIG. 14B also describes the imaging position of the image sensor.

FIGS. 14A and 14B describe the imaging position of the image sensors. The image sensors 61a and 61b are disposed in such positions as to take images of the two corners P1 and P3 of the substrate S when the substrate S is transferred to a predetermined position above the support plate 1210 (directly above the target mounting position on the second holding member 400). For example, the substrate S is placed in the target mounting position on the second holding member 400 on the support member 1210, and the image sensors 61a and 61b are beforehand adjusted in position and then attached to the mounting member 73. In the present embodiment, the image sensors 61a and 61b, as shown in FIGS. 14A and 14B, are attached so that a center C of an imaging portion (e.g., a lens) is located in a planar view at a position inwardly displaced by predetermined distances Δx, Δy in the x- and y-directions from the corners P1 and P3 of the substrate S. In other words, the center C of the image sensors 61a and 61b corresponds to a position located further inside the corners (apexes) of the substrate S. According to the foregoing configuration, the image sensors 61a and 61b can take an image of a wider area near the corners P1 and P3 of the substrate S, which improves accuracy in detecting the positions of the corners. For example, it is possible to take an image of a longer area of two adjacent sides (L1-L4, L2-L3), resulting in higher accuracy in calculating the positions of the corners P1 and P3 as an intersection point of two adjacent sides and in calculating the rotation angle θ of the substrate S, which is calculated from inclination of at least one of the two adjacent sides. The distance at which the center C of the imaging portion is displaced to be located inside of the substrate S may vary depending on the image sensor. Alternatively, it is also possible to inwardly displace the center of the imaging portion of some of the image sensors only. In another embodiment, the center of the imaging portions of some or all of the image sensors may coincide with the position of a corner (apex) of the substrate or may be located outside the corner (apex) of the substrate, in a planar view.

The illuminating devices 62a and 62b may be, for example, rectangular backlights (FIGS. 3A and 3C). The backlights may be, for example, of CA-D series produced by Keyence Corporation. The backlights may be, for example, ones having an illumination range of 77 mm×77 mm. The illuminating devices 62a and 62b are attached to the arms 64a and 64b of the rotating devices 63a and 63b and capable of moving between their respective imaging positions (FIGS. 4A to 4C) opposed to the image sensors 61a and 62a and their respective retracting positions (FIG. 3A to 3C) to which the illuminating devices are translated by being moved outward from the imaging positions. The illuminating devices 62a and 62b, once moved to the retracting positions, do not obstruct the transfer path through which the substrate S that has been imaged is transferred to the second holding member 400. The rotating devices 63a and 63b may be, for example, rotary actuators comprising air cylinders. The rotating devices 63a and 63b may be any devices of drive sources and drive mechanisms as long as they are capable of moving the illuminating devices 62a and 62b between their respective imaging positions and their respective retracting positions. Although the rotating devices 63a and 63b are preferable from the aspect of space saving, any linear motion devices may be used instead, which linearly move the illuminating devices 62a and 62b between their respective imaging positions and their respective retracting positions.

The controller 60a is mounted on the mounting member 72. The controller 60a comprises a memory storing predetermined programs, a CPU for executing the programs stored in the memory, and a control section that is materialized by execution of the programs by the CPU. The programs in the memory include a program for controlling the imaging of the image sensors 61a and 61b and a program for calculating the center position and rotation angle of the substrate S on the basis of captured images. The programs in the memory also include a program for controlling the movement of the rotating devices 63a and 63b of the illuminating devices 62a and 62b and a program for controlling turning on and off of the illuminating devise 62a and 62b.

Figure 5:
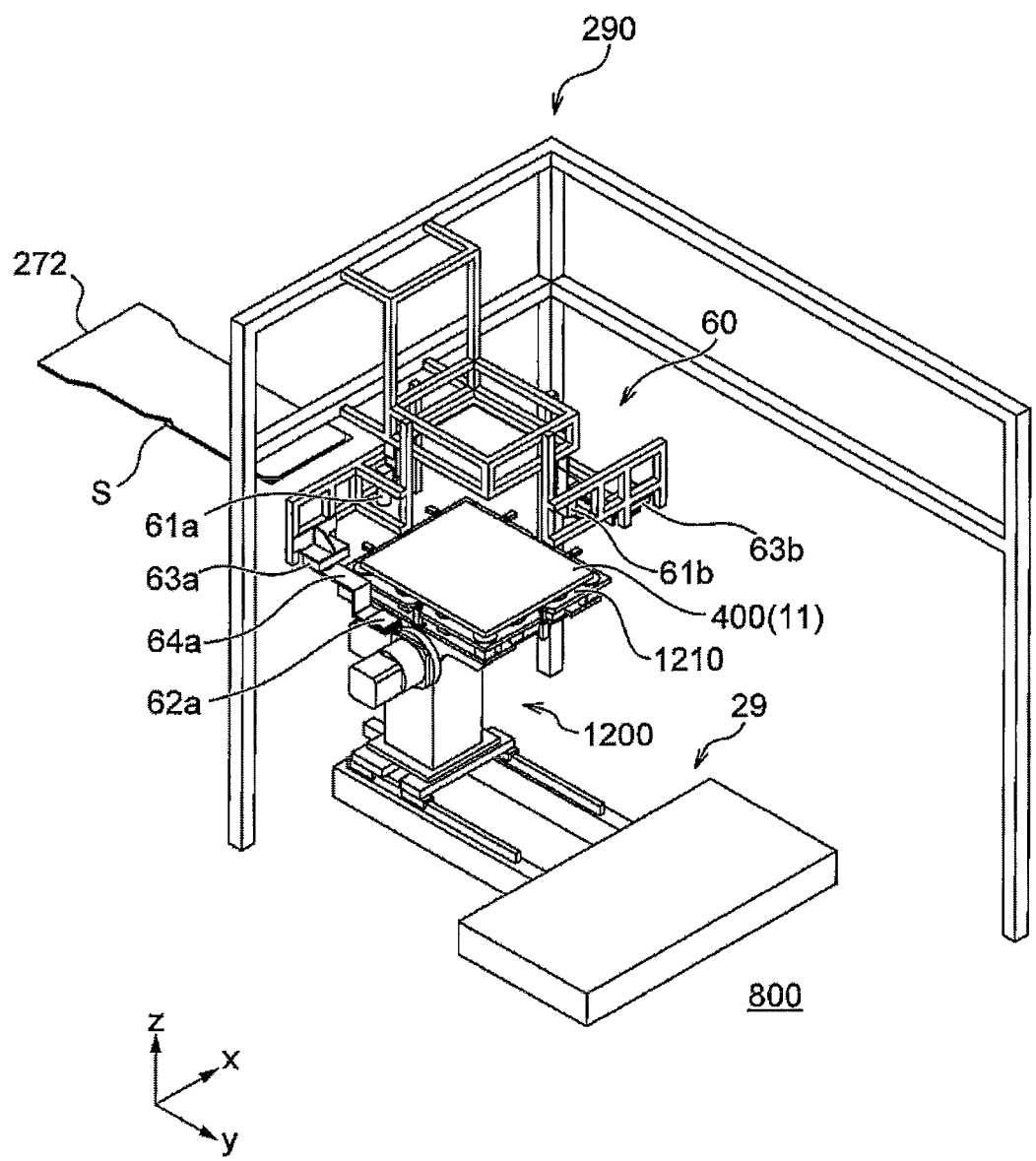
FIG. 5 is a perspective view of the substrate position detector with a substrate in proximity to the imaging position.
Figure 6:
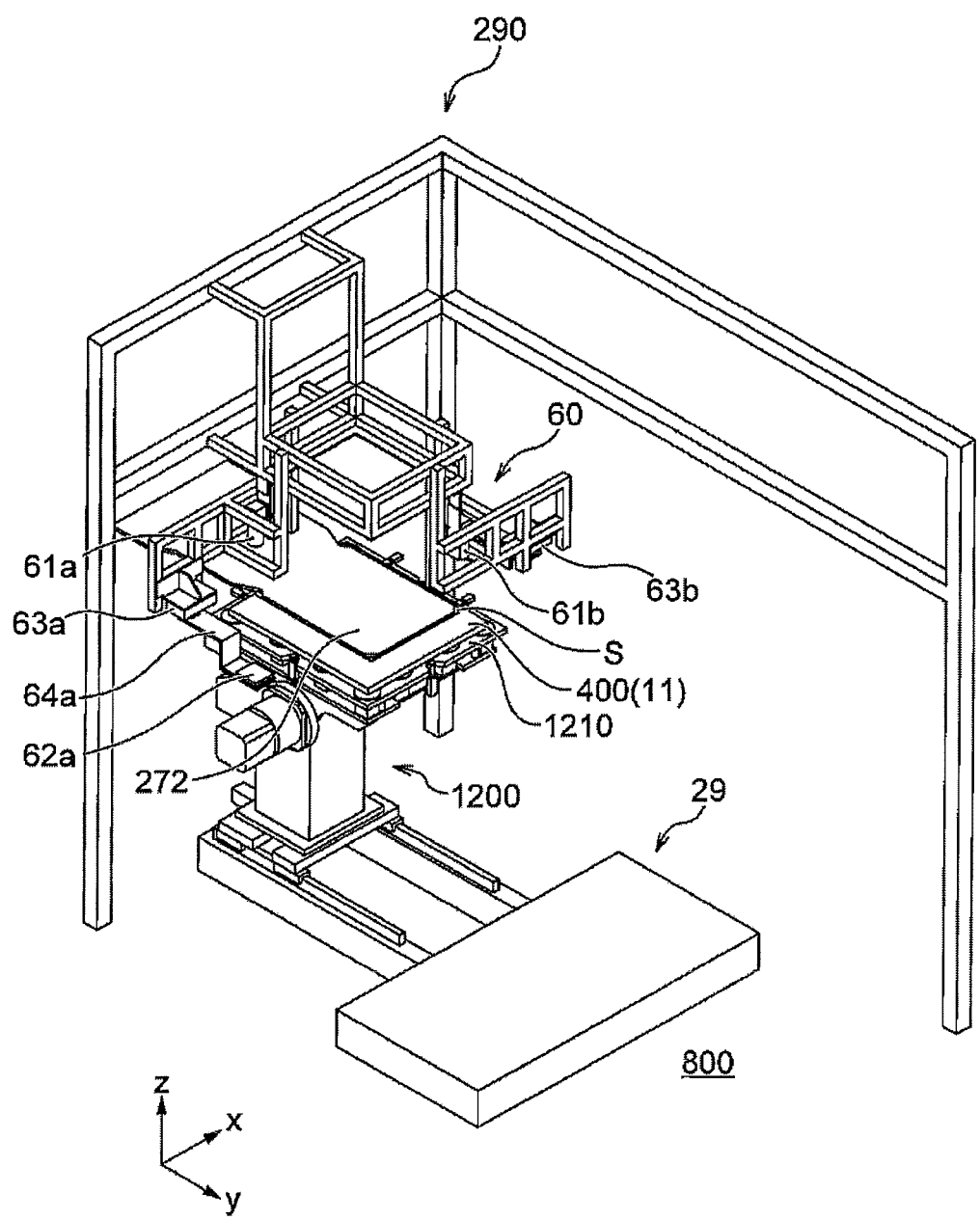
FIG. 6 is a perspective view of the substrate position detector with the substrate located at the imaging position.
Figure 7A:
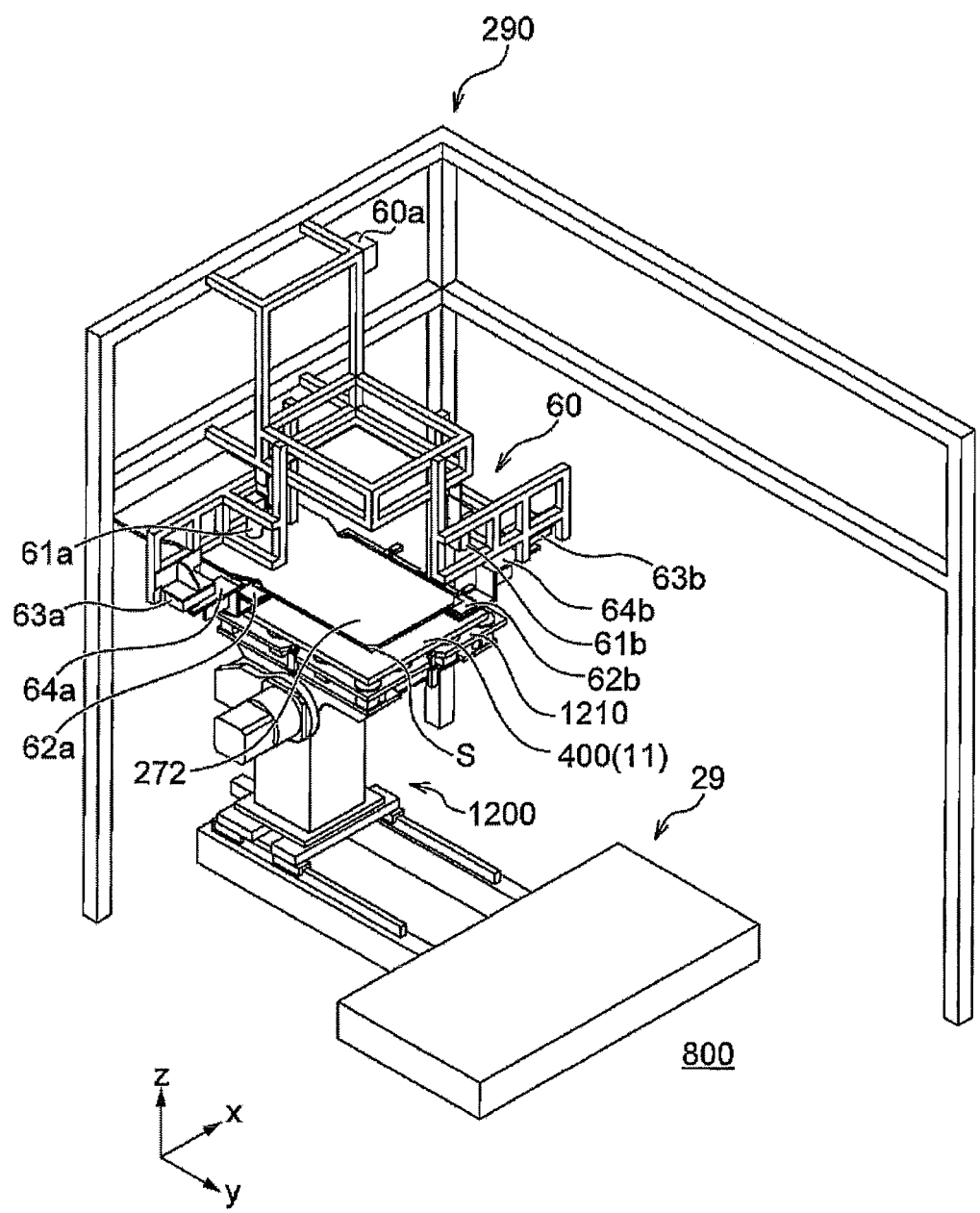
FIG. 7A is a perspective view of the substrate position detector with an illuminating device transferred to the imaging position.
Figure 7B:
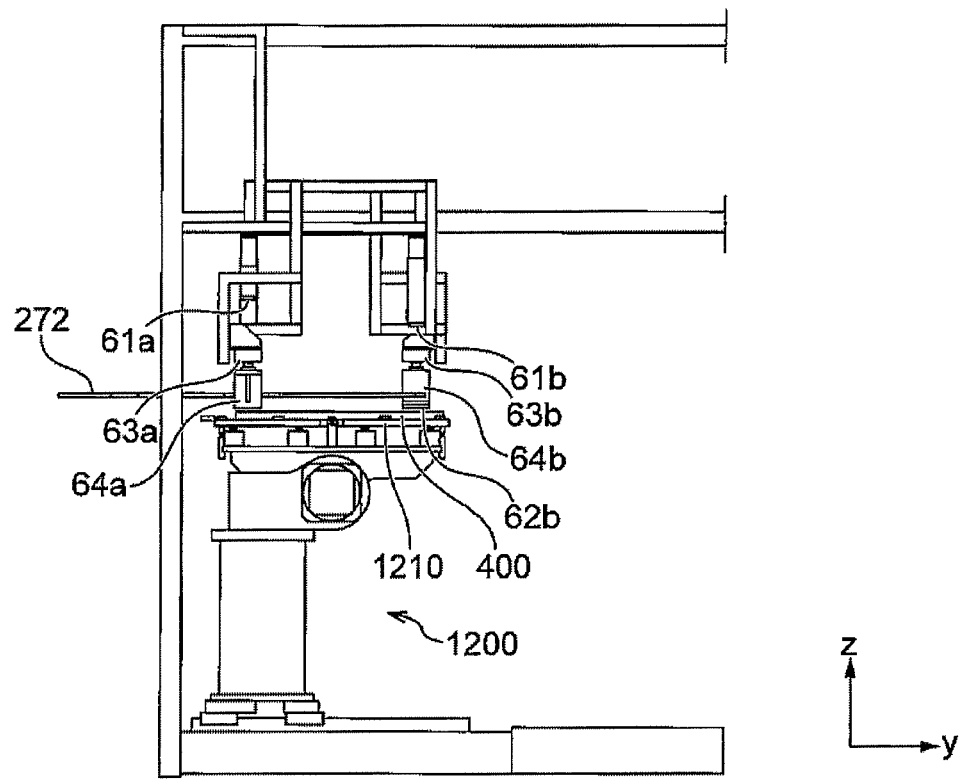
FIG. 7B is a side view of the substrate position detector with the illuminating device transferred to the imaging position.
Figure 7C:
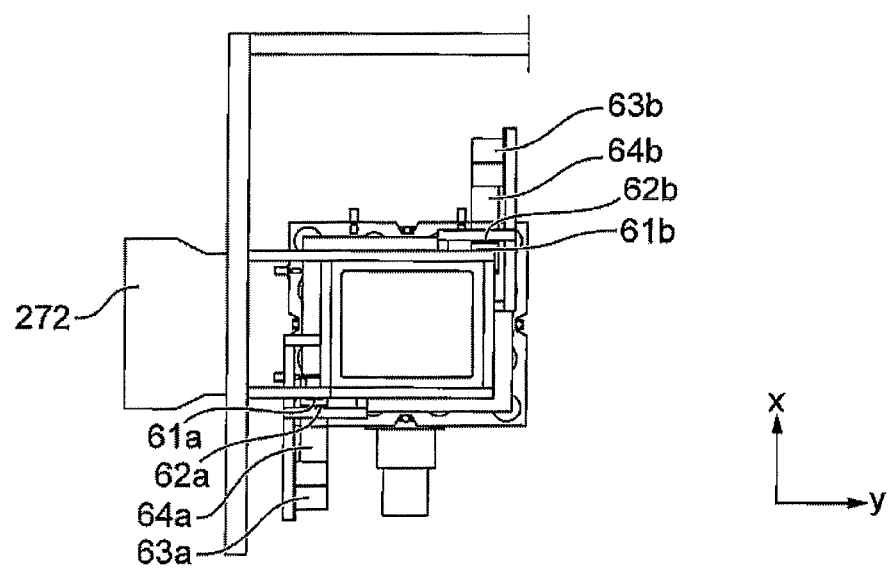
FIG. 7C is a plan view of the substrate position detector with the illuminating device transferred to the imaging position.
Figure 8:
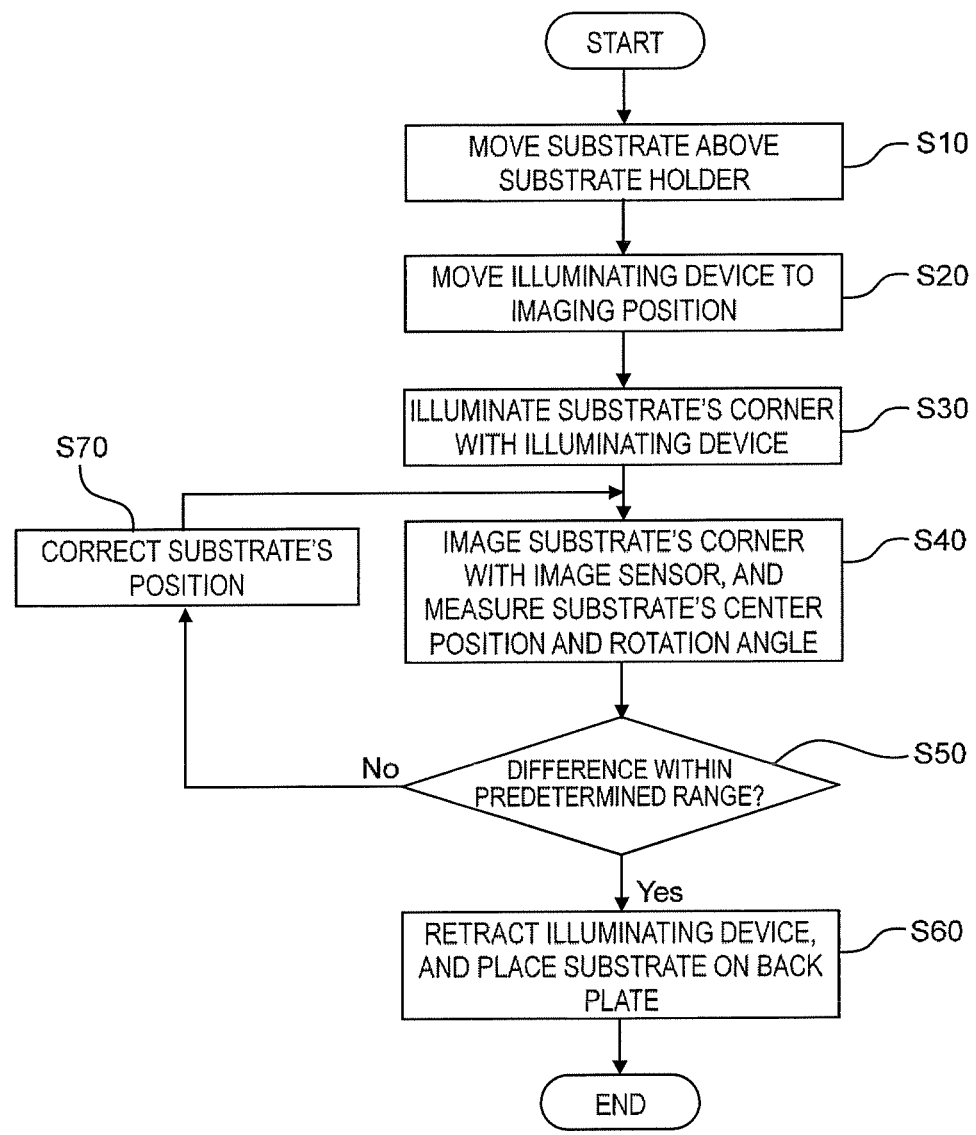
FIG. 8 is a flowchart of a substrate position adjusting process.

FIG. 5 is a perspective view of the substrate position detector 60 with the substrate S in proximity to or approaching the imaging position. FIG. 6 is another perspective view of the substrate position detector 60 with the substrate S placed in the imaging position. FIGS. 7A, 7B, and 7C are a perspective, a side, and a plan view of the substrate position detector 60 with the illuminating devices 62a and 62b moved to the imaging position. FIG. 8 is a flowchart of a substrate position adjusting process. The substrate position adjusting process of the present embodiment will be described with reference to FIGS. 5 to 8. The substrate position adjusting process according to the present embodiment is carried out by the controller 175 for controlling the entire substrate processing device 100, the controller 60a for controlling the substrate position detector 60, and the controller 27a for the transfer robot 27, in consort with one another. The substrate position adjusting process according to the present embodiment may be carried out only by the controller 60a and the controller 27a after a transfer command from the controller 175 is received.

Prior to the start of the substrate position adjusting process, the second holding member 400 of the substrate holder 11 is fixedly positioned on the support plate 1210 of the rotating device 1200, as shown in FIG. 5.

In step S10 of FIG. 8, the substrate S is transferred by the robot hand 272 of the transfer robot 27 to directly above the target mounting position on the second holding member 400 (FIGS. 5 and 6). In the present embodiment, the substrate S is held on the bottom surface of the robot hand 272. The target mounting position on the second holding member 400 is preset as a position (target center position ($x_t$, $y_t$)) at which the center of the substrate S is supposed to be positioned on the second holding member 400 and a direction (target rotation angle $\theta_0=0$) in which the substrate S is supposed to be oriented. The target mounting position is stored in the controller 175, the controller 60a, and/or the controller 27a.

In step S20, the illuminating devices 62a and 62b are rotationally transferred from their respective retracting positions to their respective imaging positions by the rotating devices 63a and 63b. The imaging positions are where the illuminating devices 62a and 62b are opposed to the image sensors 61a and 61b and below the two corners P1 and P3 (FIG. 11) on a diagonal of the substrate S (FIGS. 7A to 7C).

In step S30, the illuminating devices 62a and 62b are turned on to illuminate the two corners P1 and P3 on the diagonal of the substrate S. The illuminating devices 62a and 62b may be turned on either before or after they are rotationally transferred to the imaging position. Alternatively, the illuminating devices 62a and 62b may be always on. In short, either step S20 or S30 may precede the other, and steps S20 and S30 may be carried out at the same time. Control of the illuminating devices 62a and 62b and the rotating devices 63a and 63b may be carried out by the controller 175 and the controller 60a or by the controller 60a.

Step S40 uses the image sensors 61a and 61b to take images of the corners P1 and P3 of the substrate S and thus obtains image data of two adjacent sides at the corners P1 and P3. The image data include the direction of the straight segments of the two adjacent sides L1-L4 and L2-L3 on the x-y plane, and a set of coordinates of points constituting the straight segments of the two adjacent sides. From the image data of the two adjacent sides at each corner, the intersection point of the two adjacent sides is calculated as the positions ($x_1$, $y_1$), ($x_3$, $y_3$) of the corners P1 and P3. A process of extending the straight segment of each side is carried out, as necessary. The center position ($x_0$, $y_0$) is then calculated as the midpoint of the diagonal connecting the positions ($x_1$, $y_1$) and ($x_3$, $y_3$) of the corners P1 and P3. Among the image data on the two adjacent sides at each corner, an inclination angle of the side L4 and/or side L2 relative to the x-axis is calculated as the rotation angle $\theta$. For example, an inclination angle of the side L4 relative to the x-axis is calculated as the rotation angle $\theta$ (FIG. 12). A rotation angle of the side L4 from the x-axis and a rotation angle of the side L2 from the x-axis may be averaged to obtain the rotation angle $\theta$ of the substrate S. The inclination angle of the sides L1 and L3 relative to the y-axis may be calculated as the rotation angle $\theta$. An average value of the inclination angle of the side L4 and side L2 relative to the x-axis and the inclination angle of the sides L1 and L3 relative to the y-axis may be calculated as the rotation angle $\theta$. In this case, the directions of measurement of inclination angles relative to the x-axis and the y-axis are aligned with each other.

Step S40 calculates error between the calculated center position ($x_0$, $y_0$) and rotation angle $\theta$ of the substrate S on the one hand and the target central position ($x_t$, $y_t$) and the target rotation angle $\theta_0=0$ on the other hand. The imaging of the image sensors 61a and 61b is controlled by the controllers 175 and 60a or by the controller 60a. The calculation is carried out by the image sensors 61a and 61b, the controller 60a, and/or the controller 175.

Step S50 determines whether the error between the calculated center position ($x_0$, $y_0$) and rotation angle $\theta$ of the substrate S on the one hand and the target central position ($x_t$, $y_t$) and the target rotation angle $\theta_0=0$ on the other hand is within a predetermined range. More specifically, it is determined whether the error is within the predetermined range or whether an absolute value of the error is equal to or less than a predetermined value. For example, it is determined whether the error in the rotation angle is equal to or greater than a first predetermined value and equal to or less than a second predetermined value (an absolute value of the first predetermined value and that of the second predetermined value may be either equal to or different from each other) or whether the absolute value of the error is equal to or less than a predetermined value. It is also determined whether the error in the center position is equal to or greater than a third predetermined value and equal to or less than a fourth predetermined value (an absolute value of the third predetermined value and that of the fourth predetermined value may be either equal to or different from each other) or whether the absolute value of the error is equal to or less than a predetermined value. If the error between the rotation angle and the central position is within a predetermined range, it is determined that the error is within the predetermined range. Otherwise, it is determined that the error is out of the predetermined range. This determination is made by the controller 175 or by the controller 60a.

If the error is within the predetermined range, the process advances to step S60. In step S60, the illuminating devices 62a and 62b are rotationally transferred to their respective retracting positions by the rotating devices 63a and 63b. Subsequently, the substrate S is moved down by the robot hand 272 onto the second holding member 400.

If the error is outside the predetermined range, the process advances to step S70. In step S70, the robot hand 272 is moved in accordance with the measured error to correct the position of the substrate S so as to bring the center position and rotation angle of the substrate S close to the target center position and the target rotation angle. The process then returns to step S40 to repeat steps S40, S50, and S70 until step S50 determines that the error in the position of the substrate S is within the predetermined range.

When step S50 determines that the error in position of the substrate S is within the predetermined range, step S60 rotationally transfers the illuminating devices 62a and 62b to their respective retracting positions by using the rotating devices 63a and 63b and then moves down the substrate S onto the second holding member 400 by using the robot hand 272. The illuminating devices 62a and 62b may be turned off at any desired timing after step S50 determines that the error in position of the substrate S is within the predetermined range.

After the substrate S is placed on the second holding member 400, the substrate S is secured to the second holding member 400 by a securing member, not shown, on the second holding member 400, and the support plate 1210 of the rotating device 1200 is vertically rotated at an angle of 90 degrees. Subsequently, the rotating device 1200 moves ahead toward the first holding member that is vertically held by a holder station, not shown, and presses the second holding member 400 against the first holding member, and the second holding member 400 is fixed to the first holding member by a clamp, not shown. In this way, the substrate S is securely held between the second holding member 400 and the first holding member of the substrate holder 11.

According to the substrate position adjusting process, the substrate S can be placed at the proper position on the second holding member 400 on the basis of the positions of two corners on a diagonal of the substrate S even if there is tolerance in dimensions of substrates. Since two adjacent sides at two corners on a diagonal of the substrate S are imaged to measure and correct the center position and the rotation angle of the substrate S, the positioning accuracy can be improved.

The substrate S is illuminated by the illuminating device 62 from one side, and at the same time, the positions of corners of the substrate are detected by the image sensor 61 from the other side. This enhances contrast between the substrate S and its background, making it possible to detect the outline of the substrate S clearly. This further improves the accuracy in detecting the position of the substrate S.

Since the center position and rotation angle of the substrate S is calculated on the basis of image data on straight segments of two adjacent sides at the corners of the substrate S, it is possible to precisely determine the position of the corner and accurately calculate the center position even if the corner of the substrate S is rounded or if the apex is obscure.

Second Embodiment

Figure 9:
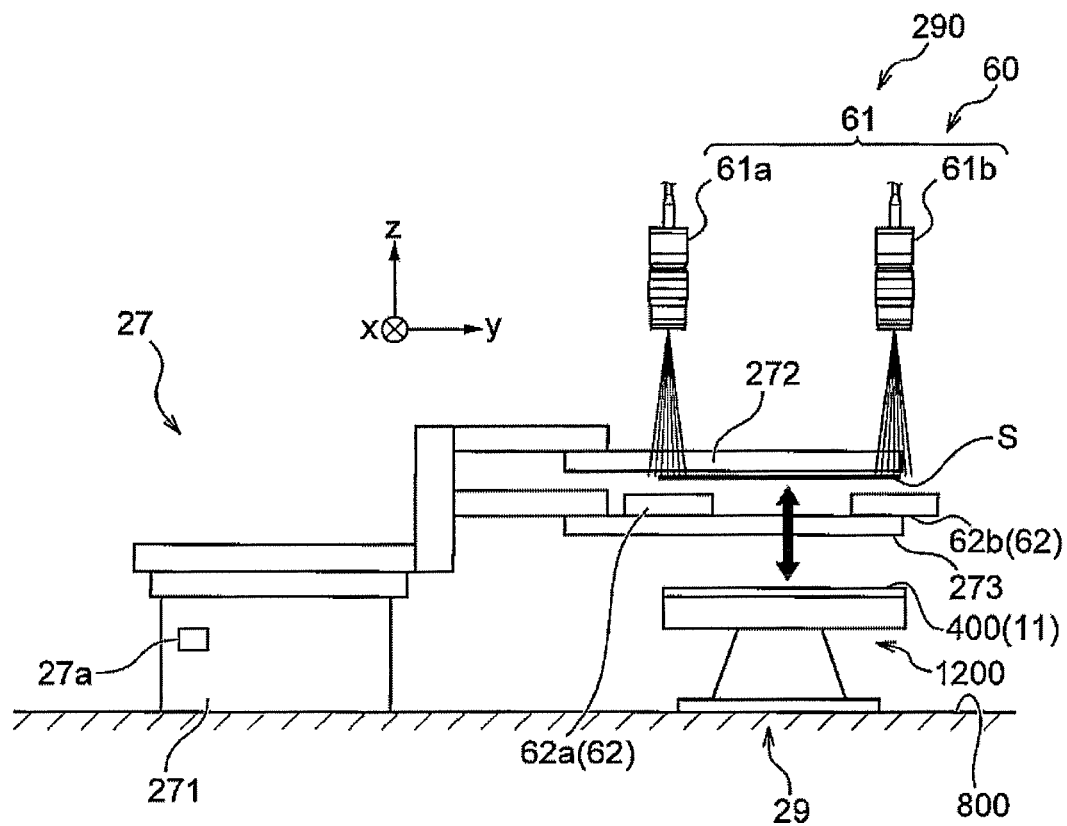
FIG. 9 is a schematic view of a substrate position detector according to a second embodiment.
Figure 10:
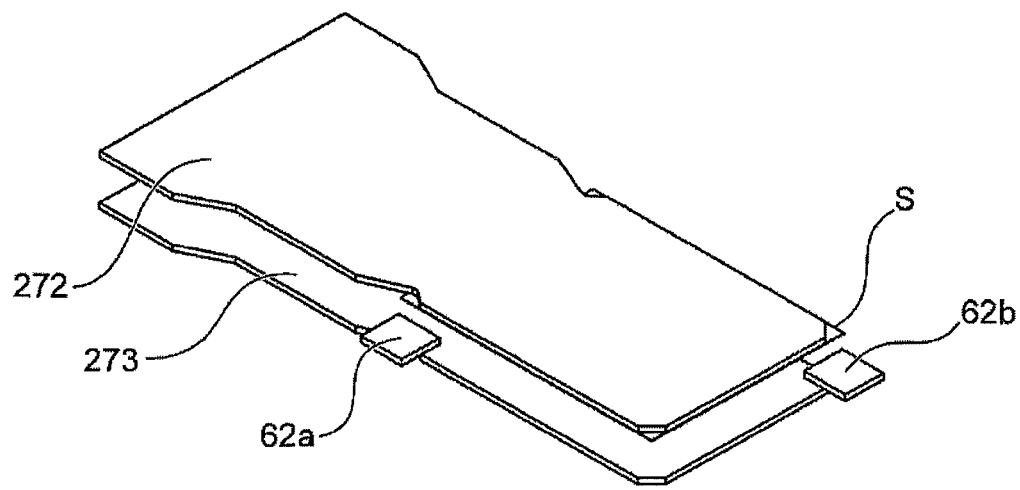
FIG. 10 is a perspective view of a mounting structure of the illuminating device according to the second embodiment.

FIG. 9 is a schematic view of a substrate position detector according to the second embodiment. FIG. 10 is a perspective view of a mounting structure of the illuminating devices according to the second embodiment. In the embodiment, the illuminating devices 62a and 62b are disposed in the substrate mounting/dismounting section 290. In the present embodiment, the illuminating devices 62a and 62b are disposed in the substrate transfer device 270 (transfer robot 27). The elements are provided with the same reference numerals as those of the first embodiment, and repetitive descriptions will be omitted.

In the present embodiment, the transfer robot 27 comprises the robot hand 272 and a robot hand 273. The robot hand 272 is a so-called dry hand for transferring the substrate S which is to be processed. As the robot hand 272 is the same as the robot hand 272 of the first embodiment, a description thereof will be omitted. The robot hand 273 is a so-called wet hand for transferring the substrate S that has been processed and has not yet been cleaned and dried. A plating solution or cleaning liquid may drop from the substrate S after the plating, so that the robot hand 273 is disposed below the robot hand 272 to prevent contamination of the robot hand 272.

As with the robot hand 272, the robot hand 273 holds the substrate S on its bottom surface. Just like the robot hand 273, the substrate S is held in a contact or non-contact manner. As shown in FIG. 10, the illuminating devices 62a and 62b are attached to the top surface at two places, which is opposite to the bottom surface on which the substrate S is held. The illuminating devices 62a and 62b are attached to positions corresponding to the two corners P3 and P1 (FIG. 11) on a diagonal of the substrate S. When the substrate S is transferred by the robot hand 272 to directly above the target mounting position on the second holding member 400 as described in the first embodiment, the robot hand 273 (preferably not in a state holding the substrate S) is disposed below the robot hand 272. At this stage, the illuminating devices 62a and 62b are positioned below the two corners P3 and P1 on a diagonal of the substrate S and are opposed to the image sensors 61a and 61b. In other words, the illuminating devices 62a and 62b are moved by the robot hand 273 to the same imaging positions as those in the first embodiment. In this state, the illuminating devices 62a and 62b illuminate the corners P1 and P3 of the substrate S, and at the same time, the image sensors 61a and 61b take images of the corners P1 and P3 of the substrate. After the substrate S is positioned, the illuminating devices 62a and 62b are moved to their respective retracting positions by the robot hand 273. In the present embodiment, the illuminating devices 62a and 62b are moved by moving the robot hand 273 and is controlled by the controller 175 and/or the controller 27a. Either the robot hand 272 or 273 may be moved before the other. The robot hands 272 and 273 may be moved at the same time.

The present embodiment is similar to the first embodiment in structures and controlling method, except for the mounting structure of the illuminating devices 62a and 62b, and the method of moving the illuminating devices 62a and 62b to the imaging positions. The control according to the second embodiment is the same as that of the first embodiment except that step S20 in the flowchart of FIG. 8 uses the robot hand 273 to move the illuminating devices 62a and 62b to the imaging positions, that step S30 uses the controller 27a of the transfer robot 27 to turn on the illuminating devices 62a and 62b, and that step S60 uses the robot hand 273 to move the illuminating devices 62a and 62b to the retracting positions.

According to the present embodiment, the substrate mounting/dismounting section 290 is not provided with the illuminating devices 62a, 62b, the rotating devices 63a, 63b, and the mounting members 74a, 74b, which saves space in the substrate mounting/dismounting section 290. The illuminating devices are mounted on robot hands that inherently include a moving function, so that the rotating devices 63a and 63b can be omitted, which move the illuminating devices 62a and 62b between their respective imaging positions and their respective retracting positions.

Third Embodiment

Below is one example of a case in which setup conditions of the illuminating devices 62a and 62b are changed or adjusted in the flowchart of FIG. 8. In the one example, the setup conditions of the illuminating devices 62a and 62b can be changed according to characteristics of the substrate S. The characteristics of the substrate S include the material and/or thickness of the substrate S. The characteristics of the substrate S may include types of the substrate S. The setup conditions of the illuminating devices include light quantity and/or wavelength of output light of the illuminating devices. The setup conditions of the illuminating devices may include other setup conditions. A multi-wavelength LED is preferably used to change the wavelength of the illuminating devices.

In some cases, it is preferable that the setup conditions of the illuminating devices be changed according to the material and/or thickness of the substrate S. For example, when the substrate S is thin in thickness, if the light quantity of the illuminating devices is set to a relatively small value, the output light is suppressed from transmitting through the substrate, and the outline of the substrate may become clear. In particular, when the substrate is made of glass, if the light quantity of the illuminating devices is set to a relatively small value, the output light is suppressed from transmitting through the substrate, and the outline of the substrate may become clear. When the substrate is made of resin, the output light in a short wavelength region (from 400 nm to 500 nm, both inclusive) makes the outline of the substrate clear.

FIG. 15A shows an example of formation of a database used to change the setup conditions of the illuminating devices. The database can be stored in the memory 175B of the controller 175 of the substrate processing device 100, the memory of the control device 29a, the memory of the controller 60*a*, and/or the other memories. The database may be stored in a memory located inside or outside the substrate processing device, and the controllers or the like (controller 175, control device 29*a*, and controller 60*a*) may access the database through wire or wireless communication.

In the database shown in FIG. 15A, data W on characteristics of the substrate S (characteristics data) and data a on the setup conditions of the illuminating devices (setup condition data) are stored so as to correspond to one another. The data W on characteristics of the substrate S include at least either the material or thickness of the substrate S or include data (e.g., a type of the substrate) corresponding to at least either the material or thickness of the substrate S. The data W on characteristics of the substrate S may include a position of a circuit pattern within the substrate, which circuit pattern is formed in the substrate S. The data W on characteristics of the substrate S may include other data on the substrate. The data a on the setup conditions of the illuminating devices include at least either the light quantity or wavelength of the illuminating devices. The data a on the setup conditions of the illuminating devices may include other data on the setup conditions.

For example, the data W on characteristics of the substrate may be any one of the material of the substrate, the thickness of the substrate, the type of the substrate, and a combination of two or more of these characteristics of the substrate. The data a on the setup conditions of the illuminating devices may be either the light quantity of the illuminating devices or the wavelength of the illuminating devices or may be both of the light quantity and wavelength of the illuminating devices. In the one example, it is possible to change the data on the setup conditions of the light quantity or wavelength of the illuminating devices or both the light quantity and wavelength of the illuminating devices only according to the material of the substrate. It is possible to change the data on the setup conditions of either the light quantity or wavelength of the illuminating devices or both the light quantity and wavelength of the illuminating devices only according to the thickness of the substrate. It is possible to change the data on the setup conditions of the light quantity or wavelength of the illuminating devices, and both the light quantity and wavelength of the illuminating devices, according to the material, thickness, and type of the substrate.

When the substrate whose characteristics and type are not stored in the database is to be processed, it is possible to select the characteristics stored in the database, which are closest to the characteristics (material, thickness, and type of the substrate or a combination of two or more of these characteristics) of the substrate, and use the data on the setup conditions of the illuminating devices, which correspond to the characteristics.

FIG. 15B shows a specific example of a database in which the combination of characteristics of the substrate corresponds to the data on setup conditions of the illuminating device in the database shown in FIG. 15A. In this example, the data a on setup conditions (light quantity ai and wavelength af) of the illuminating devices are stored so as to correspond to combinations of characteristics of the substrate (e.g., the material Wm and thickness Wt of the substrate). When the substrate whose characteristics and type are not stored in the database is to be processed, it is possible to select a combination of the characteristics stored in the database, which are closest to the characteristics of the substrate (material and thickness of the substrate), and use the data a on setup conditions of the illuminating devices, which correspond to the combinations of the characteristics. If the data on setup conditions of the illuminating devices are to be changed only according to the material Wm of the substrate, particulars of the thickness Wt of the substrate are omitted in FIG. 15B. Likewise, if the data on setup conditions of the illuminating devices are to be changed only according to the thickness Wt of the substrate, particulars of the material Wm of the substrate are omitted in FIG. 15B. If a change is to be made only in the light quantity ai of the illuminating devices, particulars of the wavelength af can be omitted in FIG. 15B. If the wavelength af of the illuminating devices is to be changed, particulars of the light quantity ai can be omitted in FIG. 15B.

Figure 16:
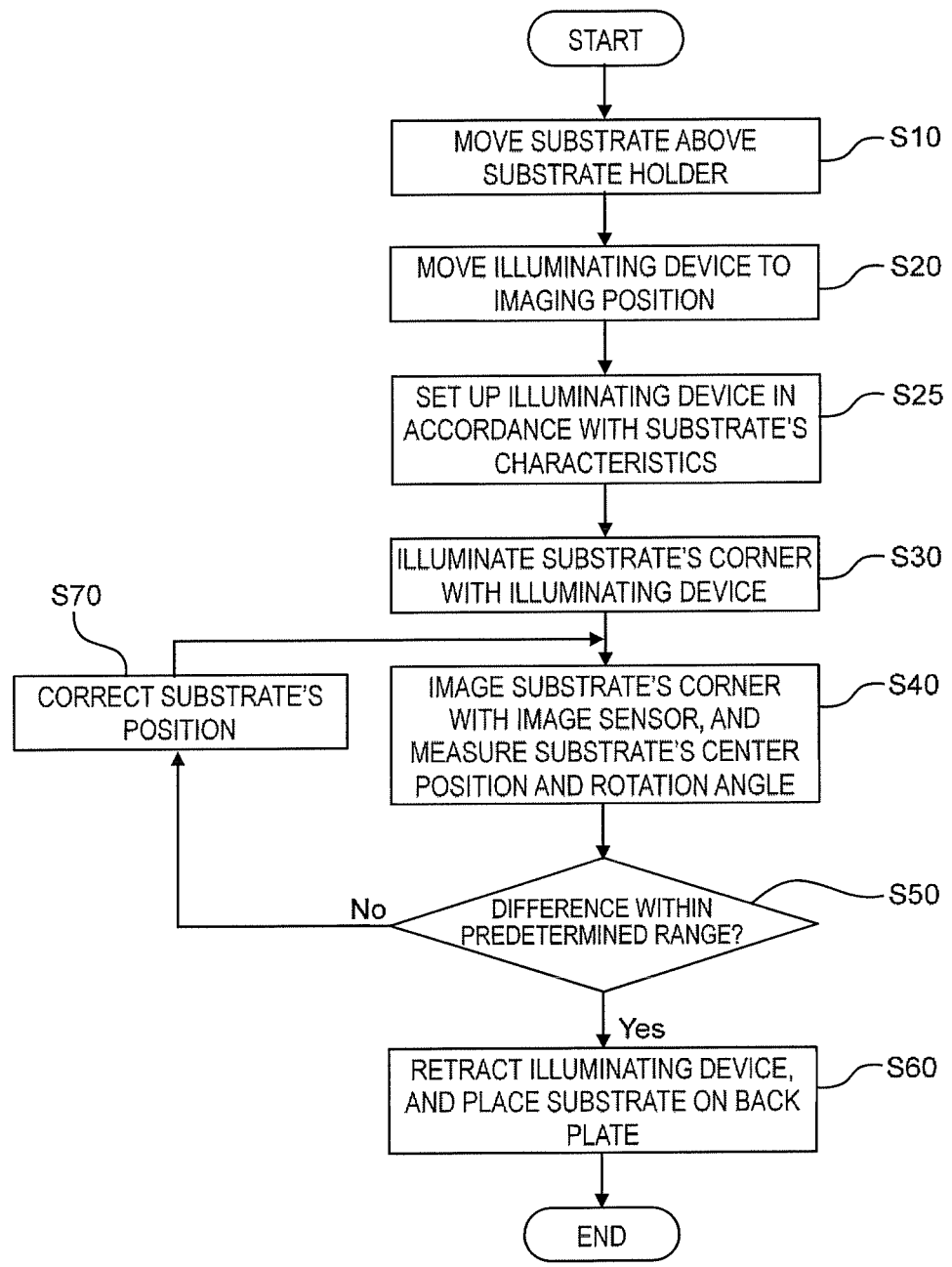
FIG. 16 is a flowchart of a substrate position adjusting process according to a third embodiment.

FIG. 16 is a flowchart of a substrate position adjusting process according to the third embodiment. In the figure, all the steps, except step S25, are similar to those shown in FIG. 8, and descriptions of the steps will be omitted. The control carried out when the setup conditions of the illuminating devices are to be changed will be described below. In step S25, the controllers (controller 175, control device 29*a*, and/or controller 60*a*) receive the data W on characteristics of the substrate S held by the substrate holder, from a recipe or the like. The controllers then access the database and read out the data a on setup conditions (light quantity and/or wavelength) of the illuminating devices, which correspond to the data W on characteristics of the substrate S (including the type of the substrate). On the basis of the readout data a on setup conditions, the controllers set up the illuminating devices 62*a* and 62*b*. When illumination is carried out by the illuminating devices in step S30, the illuminating devices which have been set up are activated to irradiate lights. The data on setup conditions may be read out from the database before the process of the flowchart in FIG. 16 starts or during the processing of the flowchart in FIG. 16. Also, the data on setup conditions may be read out from the database either before the activation of the illuminating devices or during the operation of the illuminating devices, but may be read out before the substrate is imaged by the image sensors with the illumination by the illuminating devices. The data on setup conditions of the illuminating devices may be changed according to a result of imaging of the substrate by the image sensors.

With the foregoing configuration, it is possible to enhance contrast between the substrate and the background by adjusting the setup conditions of the illuminating devices according to the characteristics of the substrate and/or reduce an influence of the substrate material and the substrate pattern, thereby to make the outline of the substrate clearer. It is consequently possible to detect the positions of corners of the substrate with higher accuracy.

Instead of storing the database, the data on setup conditions of the illuminating devices may be entered as part of the recipe. This way, the user can enter the data on setup conditions of the illuminating devices as particulars of the recipe. If the characteristics or types of the substrate are entered as particulars of the recipe, the data on setup conditions of the illuminating devices may be automatically entered as particulars of the recipe according to the characteristics or types of the substrate.

If the multi-wavelength type LED is employed as an illuminating device, the wavelength of the illuminating device may be automatically changed by the controllers, the control device or the like. According to the other embodiments, the illuminating devices may be configured so as to be switched to those with a different wavelength according to the characteristics or types of the substrate or so as to be exchanged by the user to those with a different wavelength according to the characteristics or types of the substrate.

Forth Embodiment

Figure 17:
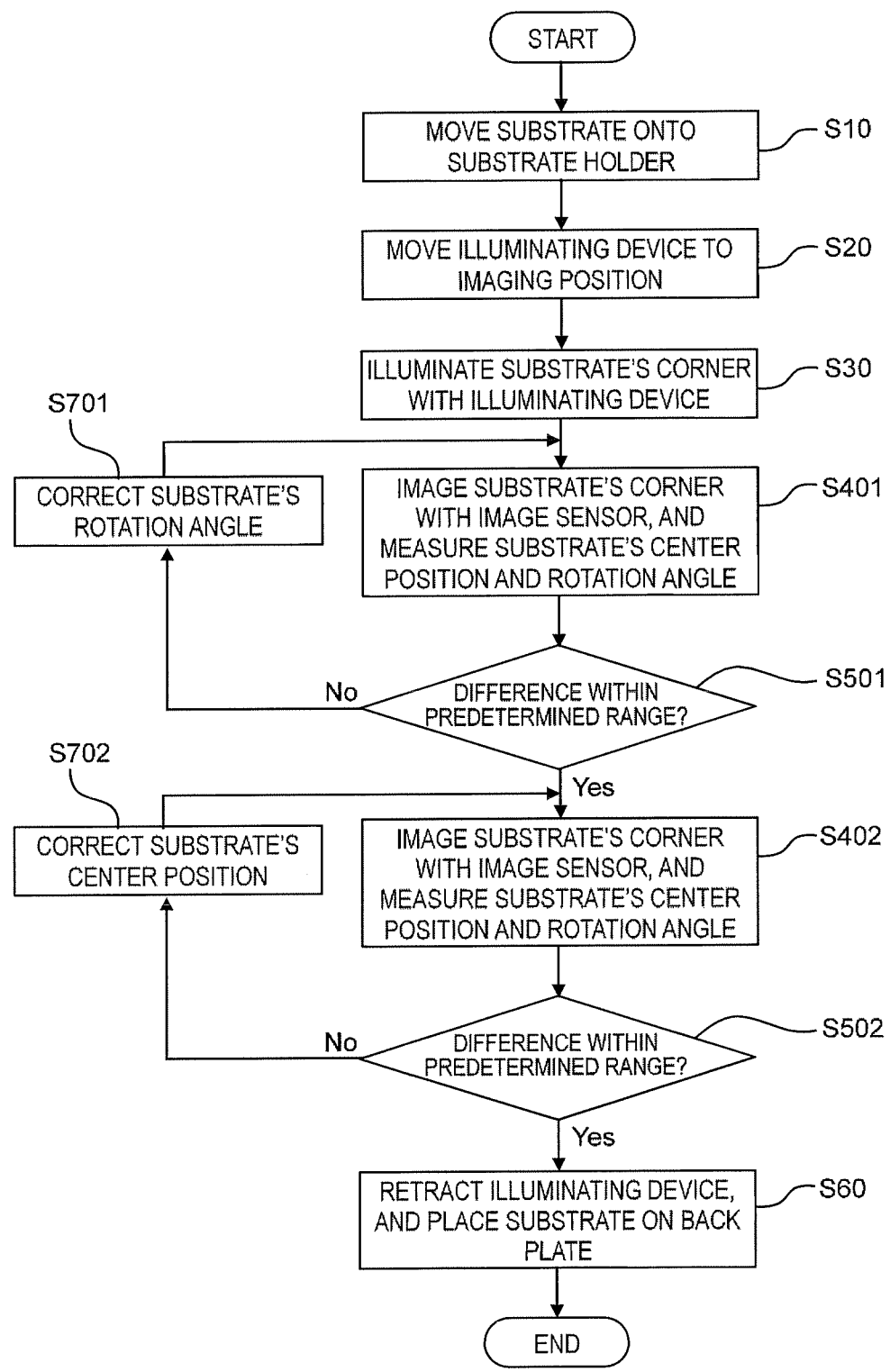
FIG. 17 is a flowchart of a substrate position adjusting process according to a fourth embodiment.

FIG. 17 is one example of a flowchart of a substrate position adjusting process according to a fourth embodiment. The flowchart includes one example of correction of the position of the substrate through steps S40, S50, and S70 in FIG. 8. In this example, after the correction of the rotation angle of the substrate, the center position of the substrate is corrected. The processing of steps S10 to S30 and S60 is the same as the one shown in the flowchart in FIG. 8, so that the descriptions thereof will be omitted.

As with step S40 in FIG. 8, step S401 takes images of the corners P1 and P3 of the substrate S by using the image sensors 61a and 61b and calculates the rotation angle θ of the substrate and the center position $(x_0, y_0)$ of the substrate. Steps S401, S501, and S701 are steps for confirming and correcting the rotation angle of the substrate. The calculation of the center position of the substrate may be therefore omitted. Step S401 also calculates an error between the calculated rotation angle θ of the substrate S and the target rotation angle $θ_0=0$.

Step S501 makes a judgment as to whether the error between the calculated rotation angle θ of the substrate S and the target rotation angle $θ_0=0$ is within a predetermined range. The judgment is carried out by the controller 175 or the controller 60a. If the error is within the predetermined range, the process advances to step S402.

If the error is out of the predetermined range, the process advances to step S701. In step S701, the robot hand 272 is moved in accordance with the measured error. By doing so, the position of the substrate S is corrected so that the rotation angle of the substrate S approximates to the target rotation angle. The process then returns to step S401. The processing of steps S401, S501, and S701 is repeated until step S501 determines that the error in the rotation angle of the substrate S is within the predetermined range. When step S501 determines that the error in the rotation angle of the substrate S is within the predetermined range, the process advances to step S402.

As with step S40 in FIG. 8, step S402 takes images of the corners P1 and P3 of the substrate S by using the image sensors 61a and 61b and calculates the rotation angle θ of the substrate and the center position $(x_0, y_0)$ of the substrate. Steps S402, S502, and S702 are steps for confirming and correcting the center position of the substrate, so that the calculation of the rotation angle of the substrate may be omitted. Step S402 calculates an error between the calculated center position $(x_0, y_0)$ of the substrate S and the target center position (xt, yt) of the substrate S.

Step S502 makes a judgment as to whether the error between the calculated center position $(x_0, y_0)$ of the substrate S and the target center position (xt, yt) of the substrate S is within a predetermined range. The judgment is carried out by the controller 175 or the controller 60a.

If step S502 determines that the error is within the predetermined range, the process advances to step S60. In step S60, the illuminating devices 62a and 62b are rotationally transferred to their respective retracting positions by the rotating devices 63a and 63b. The substrate S is then moved down by the robot hand 272 to be placed on the second holding member 400.

In step S502, if the error is out of the predetermined range, the process advances to step S702. In step S702, the robot hand 272 is moved in accordance with the measured error. By so doing, the position of the substrate S is corrected so that the center position of the substrate S approximates to the target center position. The process then returns to step S402. The processing of steps S402, S502, and S702 is repeated until step S502 determines that the error in the center position of the substrate S is within the predetermined range.

When step S502 determines that the error in the center position of the substrate S is within the predetermined range, the process advances to step S60. In step S60, the illuminating devices 62a and 62b are rotationally transferred to their respective retracting positions by the rotating devices 63a and 63b. The substrate S is then moved down by the robot and 272 to be placed on the second holding member 400. The illuminating devices 62a and 62b may be turned off at any timing after the imaging by the image sensors, for example, at any timing after step S502 determines that the error in the position of the substrate S is within the predetermined range.

According to the configuration in which the center position of the substrate is corrected after the correction of the rotation angle of the substrate, the position of the substrate S can be corrected by two steps (steps S701 and S702). When the center position and rotation angle of the substrate are to be corrected in a concurrent manner, it is necessary to correct the rotation angle after the correction of the center position, and the correction of the rotation angle may cause an error in the center position. This is because the correction of the rotation angle vastly changes the x- and y-coordinates of the center position. This results in an increase in number of times of the position correction of the substrate, which might increase the time required for the positioning of the substrate. The present embodiment makes it possible to reduce the number of times of the position correction of the substrate to twice and shorten the time required for the positioning of the substrate.

OTHER EMBODIMENTS

Modified Example 1

In the above embodiments, the image sensors 61a and 61b are disposed at the two corners P1 and P3 on a diagonal of the substrate S. However, imaging sensors may be disposed in their respective positions for imaging three or more corners. In this case, the number of illuminating devices corresponds to the number of imaging sensors. To provide three or more imaging sensors as described further improves the accuracy in detecting the position of the substrate S. For example, in FIG. 11, the positions of three corners P1 to P3 are determined, and a triangle connecting the corners P1, P2, and P3 is calculated. The triangle is then flipped over around a hypotenuse thereof. In this way, the position of the corner P4 can be calculated. The position of the center P0 can be calculated from the intersection point of the diagonal between the corners P1 and P3 and the diagonal between the corners P2 and P4. This improves the accuracy in measurement of the center position. In addition, for example, in FIG. 11, the positions of the four corners P1 to P4 are identified, and the position of the center P0 is calculated from the intersection point of the diagonal between the corners P1 and P3 and the diagonal between the corners P2 and P4. This further improves the accuracy in measurement of the center position.

If a midpoint of the diagonal segment between the corners P1 and P3 differs from a midpoint of the diagonal segment between the corners P2 and P4, and a distance between these two points is greater than a predetermined value, it may be determined that the substrate S is likely to be warped or bent when placed on the second holding member 400 or that there is an error in dimensions of the substrate. In that case, it is possible to make the robot hand 272 hold another substrate S and then place the substrate S again on the second holding member 400.

Modified Example 2

In the above embodiments, positioning is carried out with the substrate S and the second holding member 400 placed in a horizontal position. Alternatively, positioning may be carried out in a similar manner with the substrate S and the second holding member 400 in a vertical position. For example, the image sensors and the illuminating devices may be placed on the horizontally opposite sides of the substrate S placed in the vertical position to take images of the corners of the substrate S with the corners illuminated by the image sensors. In the above embodiment, the substrate S is placed from above the substrate holder. Alternatively, the present invention may also be applied to a configuration in which the substrate S is placed from below the substrate holder. In that case, the image sensors are disposed below the substrate, and the illuminating devices are placed above the substrate to be located between the substrate and the substrate holder.

Modified Example 3

In the above embodiments, the substrate is positioned relative to the substrate holder (second holding member) in the substrate mounting/dismounting section. However, the above embodiments may be applied when the substrate is positioned relative to any desired member or device. The above embodiments may be applied, for example, when the substrate is positioned relative to a table for temporal placement, a processing table, or the like of any desired substrate processing device such as a plating device, a polishing device, a grinding device, a coating device, and an etching device. The present invention can also be employed in positioning the substrate relative to a plate in a grinding device for grinding and/or polishing substrates under a work unit condition with the substrate secured to the plate.

Modified Example 4

The above embodiments are described with the examples in which the substrates are rectangular. The substrates may be square or other polygonal shapes, such as pentagonal and hexagonal shapes. The substrates may also be disc-shaped. One conceivable way of identifying the position of a disc-shaped substrate is to measure, for example, a point on the profile of the substrate at a notch position, a point opposite to the former point across the center, and other two points opposite to each other across the substrate center wherein the line connecting the latter two points crossing at right angles the line connecting former two points. It is also possible to detect the outline of the substrate in any shape with higher accuracy if image sensors and illuminating devices are disposed on the opposite sides of the substrate as in the above embodiments. When the substrate has a polygonal shape other than a square, positions of two non-adjacent corners are calculated, and a midpoint of a segment connecting corners is used as a reference position of the substrate as an alternative to the center position in the case where the substrate is square. The rotation angle of the substrate may be defined by inclination of at least one of two adjacent sides from a predetermined direction. When the substrate has a polygonal shape having an even number of sides, such as a hexagon, if two corners are selected to calculate at least one diagonal between farthest corners (longest diagonal), a midpoint of the diagonal may be used as a center position of the substrate, as in the first and second embodiments. It is also possible to calculate a rotation angle from inclination of at least one of two adjacent sides at a corner.

At least the following technical ideas can be understood from the foregoing embodiments.

[1] A substrate processing device for processing a substrate according to a first aspect comprises: an image sensor configured to detect positions of two corners on at least one diagonal of the substrate when the substrate is transferred to a predetermined position; an illuminating device that can be disposed so as to illuminate the two corners of the substrate on an opposite side of the substrate at the predetermined position relative to the image sensor; and a control device configured to determine the position of the substrate on the basis of the positions of the two corners, which are detected by the image sensor, the control device being configured to change at least either light quantity or wavelength of output light of the illuminating device in accordance with characteristics of the substrate.

According to the above-described substrate processing device, the positions of the corners of the substrate are detected by the image sensor while the substrate is being illuminated by the illuminating device from the opposite side to the image sensor. This makes it possible to enhance contrast between the substrate and background and more precisely detect a boundary between the substrate and the background (substrate's outline). It is therefore possible to detect the corners of the substrate with higher accuracy and calculate the center position of the substrate with higher accuracy. When the substrate and the substrate holder are imaged by the image sensor to detect a positional displacement of the substrate through an image analysis and when the substrate and the background (e.g., a placement surface of the substrate holder) have similar colors, it may be difficult to identify the boundary between the substrate and the background. According to the present aspect, the illumination by the illuminating device enhances the contrast between the substrate and the background, and thus makes the boundary clearer without influence of substrate materials and substrate patterns.

When there is tolerance in dimensions of the substrate, positions of edges of the substrate are varied. However, since the position of the substrate is determined on the basis of the positions of the two corners located on at least one diagonal of the substrate, the position of the substrate can be accurately obtained in spite of the tolerance in dimensions of the substrate.

Furthermore, because of the function of changing at least either the light quantity or wavelength of the output light of the illuminating device in accordance with the characteristics (material, thickness, and the like) of the substrate, it is possible to enhance the contrast between the substrate and the background and/or reduce the influence of substrate materials and substrate patterns, thereby to make the boundary clearer.

[2] According to a second aspect, in the substrate processing device of the first aspect, the characteristics of the substrate include at least one of material, thickness, and type of the substrate.

The light quantity and/or wavelength of the output light of the illuminating device can be adjusted in accordance with at least one of the characteristics of the substrate, which include the material, thickness, and type of the substrate. Also, the light quantity and/or wavelength of the output light of the illuminating device can be adjusted in accordance with the individual variability (thickness and the roundness of the corners) of the substrate.

[3] According to a third aspect, the substrate processing device of the first or second aspect includes a database in which the characteristics of the substrate correspond to at least either the light quantity or wavelength of the output light of the illuminating device.

In this case, the setup condition data (light quantity and/or wavelength) can be read out from the database in accordance with the characteristics of the substrate. It is then easy to automate the adjustment of the light quantity and/or wavelength of the illuminating device.

[4] According to a fourth aspect, in the substrate processing device of any one of the first to third aspects, the image sensor is disposed in a substrate mounting/dismounting section and measures the position of a substrate when the substrate is located near an upper, lower or lateral side of the substrate holder as a substrate holding member, which is disposed in a substrate mounting/dismounting device, and that control device places the substrate in the substrate holder after positioning the substrate in relation to the substrate holder on the basis of a result of the measurement by the image sensor.

Since the position of the substrate is measured by the image sensor at a position adjacent to the substrate holder, the substrate can be positioned by correcting the position of the substrate in relation to the substrate holder as necessary before the substrate is mounted on the substrate holder. It is therefore possible to place the substrate at a correct position in relation to the substrate holder. The accuracy in detecting the positions of the substrate's corners can be effectively improved by using a function of changing at least either the light quantity or wavelength of the output light of the illuminating device.

[5] A substrate processing device for processing a substrate according to a fifth aspect comprises: an image sensor configured to detect positions of two corners on at least one diagonal of the substrate when the substrate is transferred to a predetermined position; an illuminating device that can be disposed so as to illuminate the two corners of the substrate on an opposite side of the substrate at the predetermined position relative to the image sensor; and a control device configured to determine the position of the substrate on the basis of the positions of the two corners, which are detected by the image sensor. The control device calculates a center position and rotation angle of the substrate as a position of the substrate. If the calculated center position and rotation angle of the substrate differ from a predetermined center position and a predetermined rotation angle, the center position of the substrate is corrected to the predetermined center position after the rotation angle of the substrate is corrected to the predetermined rotation angle.

Since the center position of the substrate is corrected to the predetermined center position after the rotation angle of the substrate is corrected to the predetermined rotation angle when the center position and rotation angle of the substrate differ from the predetermined center position and the predetermined rotation angle, it is possible to reduce the time required to position the substrate in a target position (predetermined position) of the substrate.

[6] According to a sixth aspect, in the substrate processing device of the fifth aspect, the image sensor is disposed in a substrate mounting/dismounting section and measures the position of the substrate when the substrate is located near an upper, lower or lateral side of a substrate holder as a substrate holding member, which is disposed in a substrate mounting/dismounting device, and that the control device places the substrate in the substrate holder after positioning the substrate in relation to the substrate holder on the basis of a result of calculation of the center position and rotation angle of the substrate.

The position of the substrate is measured by the image sensor at a position adjacent to the substrate holder, so that it is possible to position the substrate by correcting the position of the substrate in relation to the substrate holder as necessary before the substrate is mounted on the substrate holder. The substrate therefore can be placed in a correct position in relation to the substrate holder. If the center position and rotation angle of the substrate differ from a predetermined center position and a predetermined rotation angle, the center position of the substrate is corrected to the predetermined center position after the rotation angle of the substrate is corrected to the predetermined angle. By so doing, it is possible to reduce the number of times of correction of the substrate's position and thus reduce the time required for positioning the substrate.

[7] According to a seventh aspect, a method for controlling a substrate processing device for processing a substrate comprises: changing at least either light quantity or wavelength of output light of an illuminating device in accordance with characteristics of a substrate; detecting positions of two corners on at least one diagonal of the substrate by using an image sensor located on a second surface side of the substrate while illuminating the substrate by using the illuminating device from a first surface side of the substrate when the substrate is transferred to a predetermined position; and determining a position of the substrate on the basis of the positions of the two corners, which are detected by the image sensor. The seventh aspect provides similar operation and advantageous effects to the first aspect.

[8] According to an eighth aspect, there a storage medium storing a program for causing a computer to execute a method for controlling a substrate processing device is configured so that the storage medium storing a program for causing a computer to execute: changing at least either light quantity or wavelength of output light of an illuminating device in accordance with characteristics of the substrate; detecting positions of two corners on at least one diagonal of the substrate by using an image sensor located on a second surface side of the substrate while illuminating the substrate by using the illuminating device from a first surface side of the substrate when the substrate is transferred to a predetermined position; and determining a position of the substrate on the basis of the positions of the two corners, which are detected by the image sensor. The eighth aspect provides similar operation and advantageous effects to the first aspect.

[9] According to a ninth aspect, a method for controlling a substrate processing device for processing a substrate includes: detecting positions of two corners on at least one diagonal of a substrate by using an image sensor located on a second surface side of the substrate while illuminating the substrate by using the illuminating device from a first surface side of the substrate when the substrate is transferred to a predetermined position; calculating a center position and rotation angle of the substrate as a position of the substrate; and correcting the center position of the substrate to a predetermined center position after correcting the rotation angle of the substrate to a predetermined rotation angle if the calculated center position and rotation angle of the substrate differ from the predetermined center position and the predetermined rotation angle. The ninth aspect provides similar operation and advantageous effects to the sixth aspect.

[10] According to a tenth aspect, a storage medium storing a program for causing a computer to execute a method for controlling a substrate processing device is configured so that the storage medium storing a program for causing a computer to execute: changing at least either light quantity or wavelength of output light of an illuminating device in accordance with characteristics of a substrate; detecting positions of two corners on at least one diagonal of the substrate by using an image sensor located on a second surface side of the substrate while illuminating the substrate from a first surface side of the substrate by using the illuminating device when the substrate is transferred to a predetermined position, calculating a center position and rotation angle of the substrate as a position of the substrate, and correcting the center position of the substrate to a predetermined center position after correcting the rotation angle of the substrate to a predetermined rotation angle if the calculated center position and rotation angle of the substrate differ from the predetermined center position and the predetermined rotation angle. The tenth aspect provides similar operation and advantageous effects to the sixth aspect.

[11] According to an eleventh aspect, a substrate processing device for processing a substrate comprises: an image sensor configured to detect positions of two corners on at least one diagonal of a substrate when the substrate is transferred to a predetermined position; an illuminating device that can be disposed so as to illuminate the two corners of the substrate on an opposite side of the substrate at the predetermined position relative to the image sensor; and a control device configured to determine the position of the substrate on the basis of the positions of the two corners, which are detected by the image sensor. The control device may comprise a single controller or a plurality of controllers that operate in consort.

[12] According to a twelfth aspect, the predetermined position may be a position where the substrate mounted on the substrate holding member for holding the substrate is retained. The substrate holding member includes a substrate holder, a table for temporal placement, and a processing table. According to the present aspect, it is possible to accurately identify the position of the substrate in relation to the substrate holding member, such as a substrate holder and a table for temporal placement.

[13] According to a thirteenth aspect, the image sensor may detect two adjacent sides of the substrate, and that the control device calculates a position at which the two sides intersect with each other as a position of the corner. According to the present aspect, the position of the corner of the substrate can be accurately located by locating the position at which the two adjacent corners intersect with each other. In particular, when an apex of a corner of the substrate is unclear or when the corner is rounded, the position of the corner of the substrate can be detected with accuracy.

[14] The substrate processing device according to a fourteenth aspect is configured so that the control device calculates the center position and rotation angle of the substrate as the position of the substrate. According to the present aspect, the center position of the substrate is identified from positions of two corners on at least one diagonal. The present aspect further detects positions of two adjacent sides located at a corner. On the basis of at least one of the two sides, the rotation angle of the substrate from a predetermined direction can be obtained. It is then possible to more accurately identify the position of the substrate from the center position and rotation angle of the substrate. Since the center position and rotation angle of the substrate are identified, for example, even if there is tolerance in dimensions of the substrate, the position of the substrate can be identified with accuracy.

[15] The substrate processing device according to a fifteenth aspect is configured so that the positions of the corners are positions of apexes of the substrate, and the center of the image sensor corresponds to a position closer to the center of the substrate than to the apex. According to the present aspect, it is possible to image a wider area of the substrate at the corner by using the image sensor, so that the position of the corner can be calculated with higher accuracy. For example, it is possible to use the image sensor to image a longer area of the two adjacent sides located at the corner, so that the positions of the corners and the rotation angle can be calculated with higher accuracy.

[16] The substrate processing device according to a sixteenth aspect is configured so that the control device makes a judgment as to whether the calculated position of the substrate is within a predetermined range, and corrects the position of the substrate if the position of the substrate is not within the predetermined range. According to the present aspect, the position of the substrate is corrected on the basis of the positions of two corners on at least one diagonal of the substrate, so that the position of the substrate can be corrected with accuracy even if there is tolerance in dimensions of the substrate.

[17] The substrate processing device according to a seventeenth aspect is configured so that the illuminating device is movable between an imaging position located opposite the image sensor to be located between the substrate and the substrate holder and a retracted position in which the illuminating device is retracted from between the substrate and the substrate holder. According to the present aspect, the substrate can be mounted on the substrate holder, following the retraction of the illuminating device, after the substrate is positioned using the image sensor and the illuminating device. This prevents the substrate and the illuminating device from intervening with each other.

[18] The substrate processing device according to an eighteenth aspect comprises a transfer robot as a transfer device for transferring the substrate to the predetermined position and holding the substrate. The transfer robot includes a first hand that transfers the substrate to the predetermined position and holds the substrate, and a second hand provided with the illuminating device. According to this configuration, since the illuminating device is provided to the second hand of the transfer robot, the number of illuminating devices can be reduced as compared to the case in which the illuminating device is provided to each substrate mounting/dismounting device. It is also possible to reduce changes in configuration of the other parts of the substrate mounting/dismounting section and the like. If the illuminating device is disposed on the opposite side to the substrate holding side of the second hand, it is possible to suppress an influence of the second hand on a substrate transfer performance. The first and second hands may be, for example, a so-called dry hand for transferring the substrate which is to be processed and a so-called wet hand for transferring the substrate that has been processed and has not yet been cleaned and dried.

[19] The substrate processing device according to a nineteenth aspect is configured so that the image sensor comprises first and second image sensors disposed in positions where the first and second image sensors image the two respective corners. According to this configuration, since the first and second image sensors are disposed in the positions for imaging the corners, it is possible to reduce an influence of dimensions of the substrate on dimensions of the image sensors. Each of the image sensors improves the accuracy in detecting the positions of the corners.

[20] The substrate processing device according to a twentieth aspect is configured so that the illuminating device comprises first and second illuminating devices disposed in positions where the first and second illuminating devices illuminate the two respective corners. According to the present aspect, the first and second illuminating devices are disposed in positions for illuminating the corners, so that it is possible to reduce an influence of dimensions of the substrate on dimensions of the illuminating devices. Furthermore, since an area of the substrate, other than regions necessary for position detection, is suppressed from being exposed to lights, it is possible to suppress an influence of the substrate on illuminating lights. It is also possible to efficiently illuminate the corners using the illuminating devices.

The embodiments of the invention have been described with reference to some examples. The embodiments of the invention are presented to facilitate the understanding of the invention and do not limit the invention. The invention may be modified or improved without deviating from the gist thereof. Needless to say, the invention includes equivalents thereof. For example, the plating device according to any one of the embodiments may be configured so that, after the substrate is placed in the second holding member 400, the first holding member is brought close to the substrate to hold the substrate between the first and second holding members without changing the posture of the substrate. The constituent elements mentioned in the claims and description may be combined in any ways or omitted within a scope where the problem can be at least partially solved or a scope where the advantages are at least partially provided.

The present application claims priority to Japanese Patent Application No. 2017-238793 filed on Dec. 13, 2017. The entire disclosure of Japanese Patent Application No. 2017-238793 filed on Dec. 13, 2017 including specification, claims, drawings and summary is incorporated herein by reference in its entirety.

The entire disclosure of Japanese Patent No. 5750327 (Patent Literature 1), including specification, claims, drawings and summary is incorporated herein by reference in its entirety.

REFERENCE SIGN LIST

11: Substrate holder
25: Cassette table
25a: Cassette
27: Robot
27a: Controller
270: Substrate transfer device
28: Drive mechanism
29: Substrate mounting/dismounting device
290: Substrate mounting/dismounting section
30: Stocker
32: Prewet tank
33: Presoak tank
34: Prerinse tank
35: Blow tank
36: Rinse tank
37: Substrate holder transfer device
38: Overflow tank
39: Plating tank
50: Cleaning device
50a: Cleaning section
60: Substrate position detector
61, 61a, 61b: Image sensor
62, 62a, 62b: Illuminating device
63a, 63b: Rotating device
64a, 64b: Arm
70: Frame
71: Mounting structure
72, 73, 74a, 74b: Mounting member
100: Substrate processing device
110: Unloading section
120: Processing section
120A: Pre-processing/Post-processing section
120B: Processing section
175: Controller
175A: CPU
175B: Memory
175C: Control device
271: Robot body
272, 273: Robot hand
300: First holding member
400: Second holding member
800: Mounting plane
1210: Support plate
1200: Rotating device

What is claimed is:

1. A substrate processing device for processing a substrate, comprising:
a substrate mounting/dismounting device configured to support a substrate holding member,
a multi-axis robot including a first hand for holding the substrate and configured to transfer the held substrate to the substrate mounting/dismounting device,
at least one image sensor positioned above the first hand and configured to detect positions of two corners on at least one diagonal of the substrate held by the first hand when the substrate is transferred to a predetermined position by the first hand;
at least one illuminating device located between the substrate holding member and the first hand and configured to illuminate the two corners of the substrate on an opposite side of the substrate at the predetermined position relative to the image sensor; and
a control circuit configured to determine a position of the substrate on the basis of the positions of the two corners, which are detected by the image sensor,
the control circuit being configured to change at least either light quantity or wavelength of output light of the illuminating device in accordance with characteristics of the substrate.

2. The substrate processing device according to claim 1, wherein
the characteristics of the substrate include at least one of material, thickness, and type of the substrate.

3. The substrate processing device according to claim 1, comprising:
a database in which the characteristics of the substrate correspond to at least either the light quantity or wavelength of the output light of the illuminating device.

4. The substrate processing device according to claim 1, wherein
the image sensor is disposed in a substrate mounting/dismounting section and configured to measure the position of the substrate when the substrate is located near an upper side of a substrate holder as the substrate holding member, which is disposed in the substrate mounting/dismounting device, and the control circuit places the substrate in the substrate holder after positioning the substrate in relation to the substrate holder on the basis of a result of the measurement by the image sensor.

5. A substrate processing device for processing a substrate, comprising:

a substrate mounting/dismounting device configured to support a substrate holding member, a multi-axis robot including a first hand for holding the substrate and configured to transfer the held substrate to the substrate mounting/dismounting device, at least one image sensor positioned above the first hand and configured to detect positions of two corners on at least one diagonal of a substrate held by the first hand when the substrate is transferred to a predetermined position by the first hand;

at least one illuminating device located between the substrate holding member and the first hand and configured to illuminate the two corners of the substrate held by the first hand on an opposite side of the substrate at the predetermined position relative to the image sensor, the illuminating device is movable between an imaging position between the substrate and the substrate holding member, which position is opposed to the image sensor, and a retracted position where the illuminating device is retracted from the imaging position; and a control circuit configured to determine the position of the substrate on the basis of the positions of the two corners, which are detected by the image sensor, the control circuit being configured to calculate a center position and rotation angle of the substrate as the position of the substrate, and to correct the center position of the substrate to a predetermined center position after correcting the rotation angle of the substrate to a predetermined rotation angle when the calculated center position and rotation angle of the substrate differ from the predetermined center position and the predetermined rotation angle.

6. The substrate processing device according to claim 5, wherein the image sensor is disposed in a substrate mounting/dismounting section, and configured to measure the position of the substrate when the substrate is located near an upper side of a substrate holder as the substrate holding member, which is disposed in the substrate mounting/dismounting device, and the control circuit places the substrate in the substrate holder after positioning the substrate in relation to the substrate holder on the basis of a result of calculation of the center position and rotation angle of the substrate.

7. A method for controlling a substrate processing device for processing a substrate, comprising:

changing at least either light quantity or wavelength of output light of at least one illuminating device in accordance with characteristics of the substrate;

detecting positions of two corners on at least one diagonal of the substrate held by a hand of a multi-axis robot by using at least one image sensor located on an upper side of the hand of while illuminating the substrate from a lower side of the hand by using the illuminating device positioned between the hand holding the substrate and a substrate holding member, when the substrate is transferred to a predetermined position by the hand of the multi-axis robot; and determining a position of the substrate on the basis of the positions of the two corners, which are detected by the image sensor.

8. A non-transitory storage medium storing a program for causing a computer to execute a method for controlling a substrate processing device, the storage medium storing a program for causing a computer to execute:

changing at least either light quantity or wavelength of output light of at least one illuminating device in accordance with characteristics of the substrate;

detecting positions of two corners on at least one diagonal of the substrate held by a hand of a multi-axis robot by using at least one image sensor located on an upper side of the hand while illuminating the substrate from a lower side of the robot hand by using the illuminating device positioned between the hand holding the substrate and a substrate holding member, when the substrate is transferred to a predetermined position by the hand of the multi-axis robot; and determining a position of the substrate on the basis of the positions of the two corners, which are detected by the image sensor.

9. A method for controlling a substrate processing device for processing a substrate, comprising:

moving at least one illuminating device to an imaging position between the substrate held by a hand of a multi-axis robot and a substrate holding member, which position is opposed to at least one image sensor, detecting positions of two corners on at least one diagonal of the substrate held by the hand by using the image sensor located on an upper side of the hand while illuminating the substrate from a lower side of the hand by using the illuminating device positioned between the hand holding the substrate and the substrate holding member, when the substrate is transferred to a predetermined position, calculating a center position and rotation angle of the substrate as a position of the substrate;

correcting the center position of the substrate to a predetermined center position after correcting the rotation angle of the substrate to a predetermined rotation angle when the calculated center position and rotation angle of the substrate differ from the predetermined center position and the predetermined rotation angle; and moving the illuminating device to a retracted position where the illuminating device is retracted from the imaging position.

10. A non-transitory storage medium storing a program for causing a computer to execute a method for controlling a substrate processing device, the storage medium storing a program for causing a computer to execute:

moving at least one illuminating device to an imaging position between the substrate held by a hand of a multi-axis robot and the substrate holding member, which position is opposed to at least one image sensor;

detecting positions of two corners on at least one diagonal of the substrate held by the hand by using the image sensor located on an upper side of the hand while illuminating the substrate from a lower side of the hand by using the illuminating device positioned between the hand holding the substrate and the substrate holding member, when the substrate is transferred to a predetermined position;

calculating a center position and rotation angle of the substrate as a position of the substrate;

correcting the center position of the substrate to a predetermined center position after correcting the rotation angle of the substrate to a predetermined rotation angle when the calculated center position and rotation angle of the substrate differ from the predetermined center position and the predetermined rotation angle; and moving the illuminating device to a retracted position where the illuminating device is retracted from the imaging position.

* * * * *

UNITED STATES PATENT AND TRADEMARK OFFICE
CERTIFICATE OF CORRECTION

PATENT NO. : 10,991,605 B2
APPLICATION NO. : 16/217936
DATED : April 27, 2021
INVENTOR(S) : Yamakawa et al.

Page 1 of 1

It is certified that error appears in the above-identified patent and that said Letters Patent is hereby corrected as shown below:

In the Claims

Column 27, Claim 7, Line 65 replace:
"of the hand of while illuminating the substrate from a"
With:
--of the hand while illuminating the substrate from a--

Signed and Sealed this
Tenth Day of August, 2021

Drew Hirshfeld
*Performing the Functions and Duties of the*
*Under Secretary of Commerce for Intellectual Property and*
*Director of the United States Patent and Trademark Office*